(12) United States Patent
Takagi

(10) Patent No.: US 6,984,844 B2
(45) Date of Patent: Jan. 10, 2006

(54) SEMICONDUCTOR DEVICE HAVING HETEROJUNCTION TYPE MIS TRANSISTOR WHICH CAN OPERATE AT REDUCED VOLTAGE WHILE MAINTAINING HIGH OPERATION SPEED

(75) Inventor: Takeshi Takagi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/657,799

(22) Filed: Sep. 9, 2003

(65) Prior Publication Data

US 2004/0094811 A1   May 20, 2004

Related U.S. Application Data

(63) Continuation of application No. PCT/JP03/00472, filed on Jan. 21, 2003.

(30) Foreign Application Priority Data

Jan. 21, 2002 (JP) .............................. 2002-011833

(51) Int. Cl.
H01L 29/06 (2006.01)
H01L 31/0328 (2006.01)
H01L 31/0336 (2006.01)
H01L 31/072 (2006.01)
H01L 31/109 (2006.01)

(52) U.S. Cl. .................... 257/19; 257/20; 257/213

(58) Field of Classification Search ............... 257/19, 257/20, 12, 616, 192, 213
See application file for complete search history.

(56) References Cited

U.S. PATENT DOCUMENTS 6,040,610 A   3/2000   Noguchi et al.

(Continued)

FOREIGN PATENT DOCUMENTS

EP     0 921 575 A2    6/1999

(Continued)

OTHER PUBLICATIONS

Takagi A. et al., "A Novel High Performance SiGe Channel Heterostructure Dynamic Threshold pMOSFET(HDTMOS)", IEEE Electron Device Letters, May, 2001. vol. 22, No. 5, pp. 206-208, full text.

(Continued)

Primary Examiner—Phat X. Cao
(74) Attorney, Agent, or Firm—McDermott Will & Emery LLP

(57) ABSTRACT

A semiconductor device according to the invention includes: a semiconductor layer (10–15); a gate insulator (16) provided on the semiconductor layer; a gate electrode (17) provided on the gate insulator; a source region (20*a*) and a drain region (20*b*), which are of a first conductivity type and are provided in the semiconductor layer on both sides of the gate electrode in plan view; a cap layer (25), a channel region (24), and an under-channel region (23,22), which are of a second conductivity type and are provided in the semiconductor layer between the source region and the drain region in a descending order from an interface with the gate insulator; and a bias electrode member ($V_{bs}$) for applying a voltage to the under-channel region, wherein the channel region is formed of a first semiconductor, the cap layer and the under-channel region are formed of a second semiconductor and a third semiconductor, respectively, each of which has a larger band gap than the first semiconductor, the bias electrode member is capable of applying the voltage independently of the gate electrode.

15 Claims, 17 Drawing Sheets

U.S. PATENT DOCUMENTS

| | | | |
|---|---|---|---|
| 6,319,799 B1 * | 11/2001 | Ouyang et al. | 438/528 |
| 6,633,066 B1 * | 10/2003 | Bae et al. | 257/347 |
| 6,680,496 B1 * | 1/2004 | Hammond et al. | 257/192 |
| 2002/0008289 A1 * | 1/2002 | Murota et al. | 257/369 |
| 2004/0036122 A1 * | 2/2004 | Aihara | 257/368 |

FOREIGN PATENT DOCUMENTS

| | | |
|---|---|---|
| EP | 1 102 327 A2 | 5/2001 |
| JP | P2000-260991 A | 9/2000 |
| JP | P2001-210831 A | 8/2001 |

OTHER PUBLICATIONS

Takamiya M. et al., "High Drive-Current Electrically Induced Body Dynamic Threshold SOI MOSFET (EIB-DTMOS) with Large Body Effect and Low Threshold Voltage", IEEE Transactions on Electron Devices, Aug., 2001. vol. 48, No. 8, pp. 1633 to 1640, full text.

Toshiro Hiramoto et al., "Low Power and Low Voltage MOSFETs with Variable Threshold Voltage Controlled by Back-Bias", IEICE Trans. Electron., vol. E83-C, No. 2 Feb. 2000,pp. 161-169.

Tadahiro Kuroda et al., "A 0.9-V, 150-MHz, 10-mW, 4 mm$^2$, 2-D Discrete Cosine Transform Core Processor with Variable Threshold-Voltage (VT) Scheme", IEEE Journal of Solid-State Circuits, vol., 31, No. 11, Nov. 1996, pp. 1770-1779.

* cited by examiner

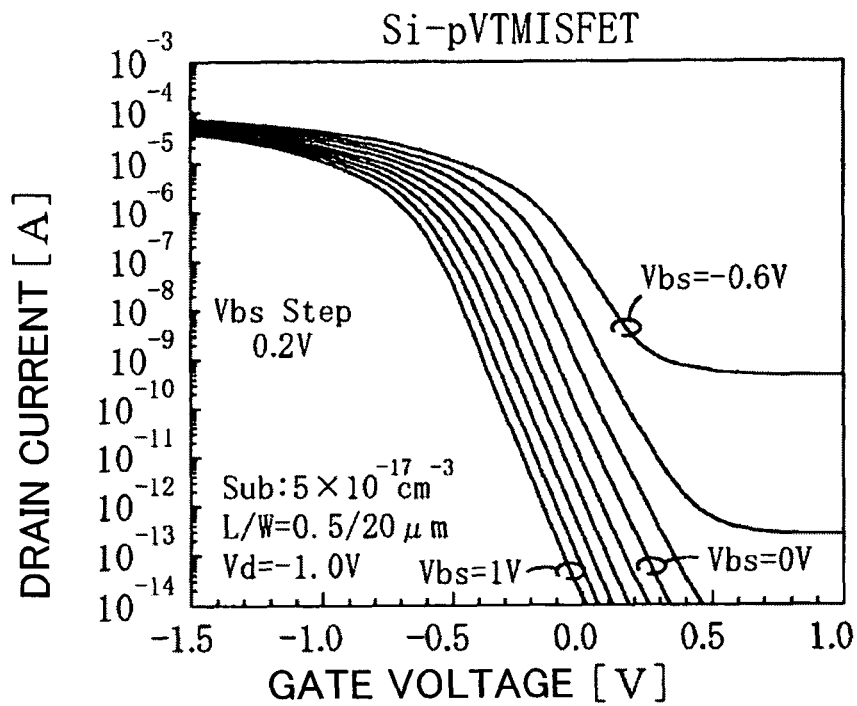
Fig. 1 1 (a)
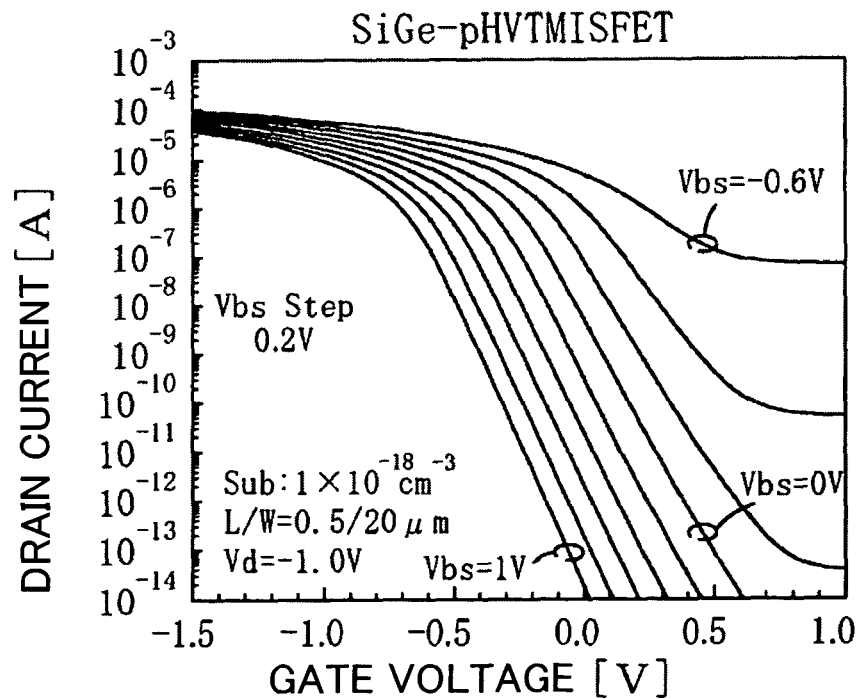
Fig. 1 1 (b)

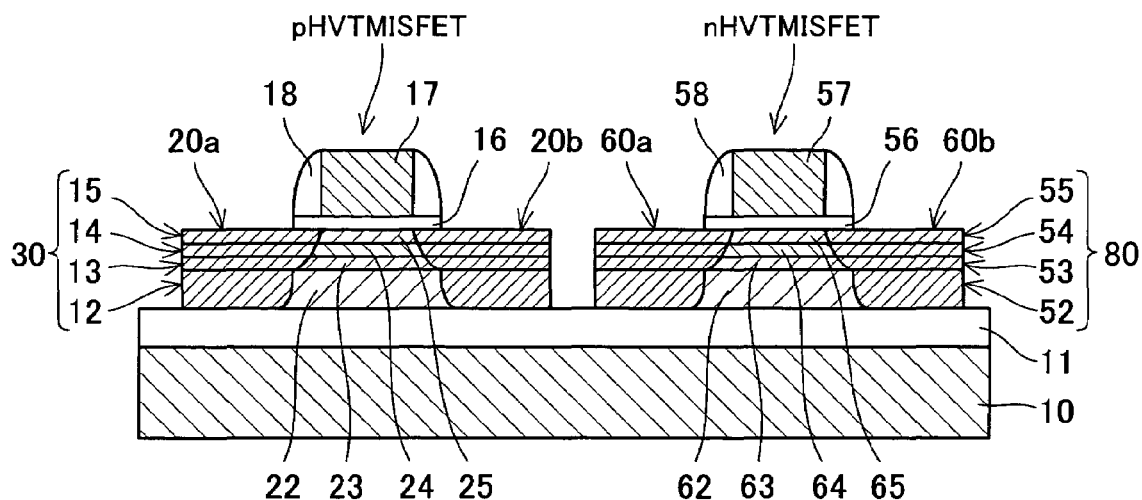
Fig. 13(a)
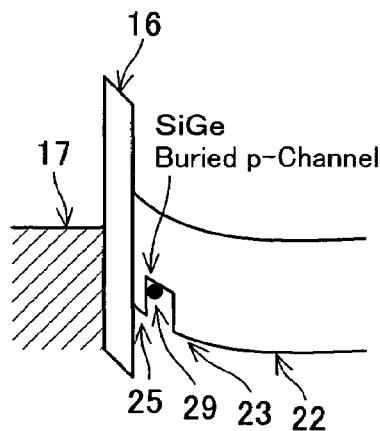 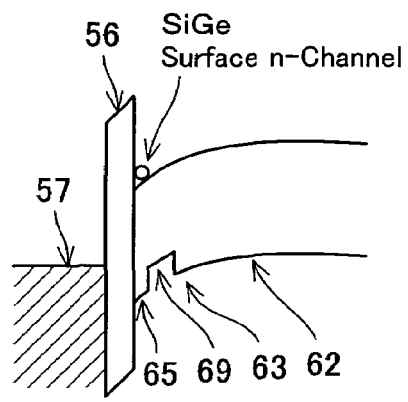
Fig. 13(b)  Fig. 13(c)

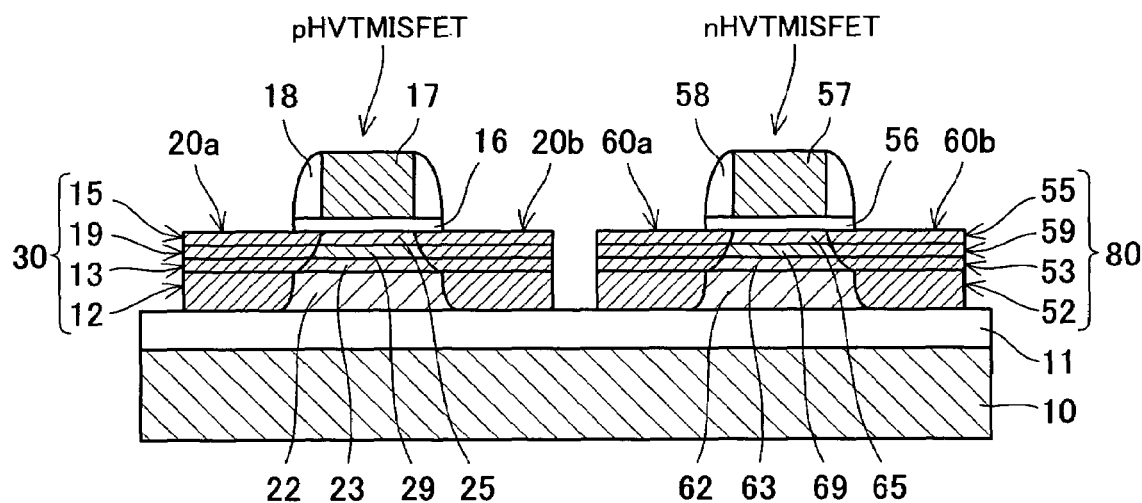
Fig. 14(a)
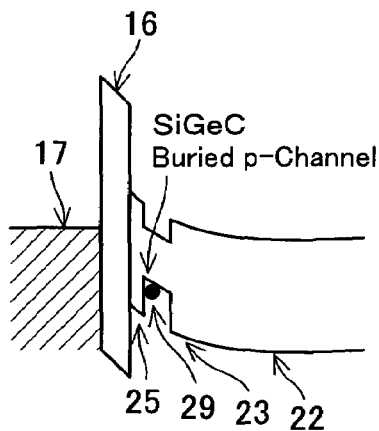   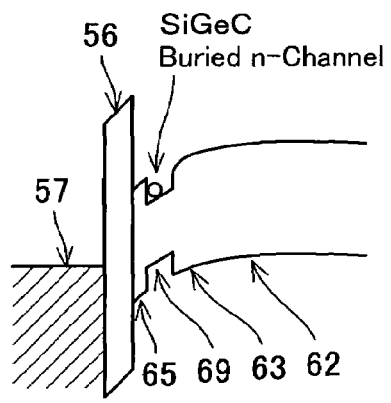
Fig. 14(b)   Fig. 14(c)

| | THRESHOLD VOLTAGE [V] | | | | |
|---|---|---|---|---|---|
| | Si-pVTMISFET $5E17cm^{-3}$ | Si-pVTMISFET $1E18cm^{-3}$ | SiGe-pHVTMISFET $1E18cm^{-3}$ | SiGe-pHVTMISFET $2E18cm^{-3}$ | SiGe-pHVTMISFET $5E18cm^{-3}$ |
| SUBSTRATE BIAS VOLTAGE [V]  1 | −0.540 | −0.842 | −0.575 | −0.942 | −1.480 |
| 0.8 | −0.494 | −0.778 | −0.499 | −0.842 | −1.350 |
| 0.6 | −0.444 | −0.660 | −0.419 | −0.733 | −1.200 |
| 0.4 | −0.392 | −0.588 | −0.332 | −0.619 | −1.044 |
| 0.2 | −0.335 | −0.510 | −0.237 | −0.494 | −0.874 |
| 0. | −0.273 | −0.427 | −0.132 | −0.355 | −0.685 |
| −0.2 | −0.202 | −0.334 | −0.008 | −0.195 | −0.470 |
| −0.4 | −0.120 | −0.228 | 0.154 | 0.010 | −0.212 |
| −0.6 | −0.009 | −0.148 | 0.559 | 0.376 | 0.177 |
| SUBSTRATE BIAS COEFFICIENT UNDER REVERSE BIAS $\gamma 1$ | −0.298 | −0.403 | −0.500 | −0.660 | −0.898 |
| SUBSTRATE BIAS COEFFICIENT UNDER FORWARD BIAS $\gamma 2$ | −0.383 | −0.498 | −0.715 | −0.913 | −1.183 |
| SUBSTRATE BIAS COEFFICIENT NEAR 0V $\gamma 0$ | −0.333 | −0.440 | −0.573 | −0.748 | −1.010 |
| SUBSTRATE BIAS COEFFICIENT RATIO $\gamma 2/\gamma 1$ | 1.286 | 1.236 | 1.430 | 1.383 | 1.318 |

$\gamma 1 : (Vth(Vbs=0V) - Vth(Vbs=-0.4V))/(0-0.4)$
$\gamma 2 : (Vth(Vbs=-0.4V) - Vth(Vbs=0V))/(-0.4-0)$

Fig. 17

SEMICONDUCTOR DEVICE HAVING HETEROJUNCTION TYPE MIS TRANSISTOR WHICH CAN OPERATE AT REDUCED VOLTAGE WHILE MAINTAINING HIGH OPERATION SPEED

This is a continuation application under 35 U.S.C. 111(a) of pending prior International Application No.PCT/JP03/00472, filed on Jan. 21, 2003.

BACKGROUND OF THE INVENTION

1. Field of the Invention

The present invention relates to a semiconductor device comprising a heterojunction type MIS transistor and, more particularly, to such a semiconductor device which can operates at a reduced voltage with its operation speed kept high.

2. Description of the Related Art

In recent years, battery-operated personal digital assistant apparatus has been widely used. It is strongly desired that such an apparatus operate at a reduced power supply voltage while keeping high-speed operation performance in order to extend the life of the battery used.

The power consumption (Pload) of a circuit comprising a complementary MIS device (cMIS device), which is caused predominantly by charge-discharge of load, is represented by the following expression (1):

$$Pload = f \cdot Cload \cdot VDD^2 \quad (1)$$

wherein f is an operation frequency of load, Cload is a load capacitance and VDD is a power supply voltage. As can be understood from the formula (1), reducing the power supply voltage VDD is very effective in reducing the power consumption. However, the operation speed of MIS transistors, in general, also lowers with lowering power supply voltage. It is therefore desired that the power supply voltage of a MIS transistor be reduced and, at the same time, the high-speed operation performance of the MIS transistor be maintained as it is.

Although lowering of the threshold voltage of a MIS transistor is effective in realizing a high-speed operation (i.e., a high driving power) with a high on-current being ensured at a low power supply voltage, generally the subthreshold leakage current increases exponentially with lowering threshold voltage. In a circuit comprising a cMIS device, power consumption based on charge-discharge of load does not occur in a stand-by state and, hence, the proportion of power consumption based on the subthreshold leakage current to the power consumption of the chip increases. As the art of reducing such a subthreshold leakage current in the stand-by state, there is known a VTMIS device (Variable Threshold-Voltage MIS device) of which the threshold voltage is controlled by varying the substrate bias, as taught by literature document 1 (T. Kuroda et. Al., "A 0.9V, 150-MHz, 10-mW, 4 mm2, 2-D Discrete Cosine Transform Core Processor with Variable Threshold-Voltage (VT) Scheme," IEEE J. Solid-State Circuits, vol.31, 1996, p.1770.), for example. When the VTMIS device is in its operating state, a high-speed operation is ensured in the device by applying a reduced substrate bias to lower the threshold voltage of the MIS transistor, whereas when the device is in its stand-by state, the leakage current is reduced in the device by applying an enhanced substrate bias to raise the threshold voltage of the MIS transistor. A MOS transistor, which is capable of controlling its threshold voltage by varying the substrate bias like the aforementioned VTMIS device, is described in literature document 2 (Japanese Patent Laid-Open Gazette No. 2000-260991, paragraphs [0004] to [0007]).

Such a VTMIS device, however, involves the following problem.

In order for a MIS transistor to realize a high-speed operation in its operating state as well as a low leakage current in its stand-by state, the threshold voltage of the MIS transistor has to shift largely with varying substrate bias. As the power supply voltage will be lowered increasingly from now on, it will be difficult to obtain a large shift in the threshold voltage of the MIS transistor. A change in threshold voltage ($\Delta V_{th}$) due to a change in substrate bias ($\Delta V_{bs}$) is represented by the following expression (2):

$$\Delta V_{th} = \gamma \cdot \Delta V_{bs} \quad (2)$$

wherein γ is a substrate bias coefficient.

Since a reduction in threshold voltage $V_{th}$ and an improvement in substrate bias coefficient γ are in a tradeoff relation to each other as taught by literature document 3 (T. Hiramoto et. Al., "Low Power and Low Voltage MOSFETs with Variable Threshold Voltage Controlled by Back-Bias," IEICE Trans. Electron., vol.E83-C, 2000, p.161), a MIS transistor having a low threshold voltage has decreased substrate bias coefficient γ undesirably. Therefore, if the threshold voltage $V_{th}$ of the MIS transistor in the operating state is lowered to lower the power supply voltage of the transistor as well as to realize a high-speed operation (i.e., a high driving power), the substrate bias coefficient γ decreases accordingly and, hence, the amount of change $\Delta V_{th}$ in threshold voltage $V_{th}$ decreases, as can be understood from the expression (2). That is, even if the MIS transistor is applied with a strong substrate bias in the stand-by state, the amount of change $\Delta V_{th}$ from the threshold voltage $V_{th}$ of the transistor in the operating state to that of the transistor in the stand-by state is not made large enough. As a result, it might be difficult to suppress the subthreshold leakage current of the MIS transistor sufficiently.

It should be noted that literature document 4 (Japanese Patent Laid-Open Gazette No. 2001-210831) discloses a MIS transistor having a low threshold voltage and a wide operating voltage range.

SUMMARY OF THE INVENTION

It is an object of the present invention to provide a semiconductor device which is capable of realizing a low off-leakage current while ensuring a high-speed operation for a MIS transistor by employing means for ensuring a sufficiently large substrate bias coefficient γ while lowering the threshold voltage of the MIS transistor.

With a view to attaining the object, a semiconductor device according to the present invention comprises: a semiconductor layer; a gate insulator provided on the semiconductor layer; a gate electrode provided on the gate insulator; a source region and a drain region, which are of a first conductivity type and are provided in the semiconductor layer on both sides of the gate electrode in plan view; a cap layer, a channel region, and an under-channel region which are provided in the semiconductor layer between the source region and the drain region in a descending order from an interface with the gate insulator the under-channel region being of a second conductivity type; and a bias electrode member for applying a voltage to the under-channel region, wherein the cap layer and the under-channel region are formed of a second semiconductor and a third semiconductor, respectively, each of which has a larger band gap than the first semiconductor, the bias electrode member is capable of applying the voltage independently of the gate electrode.

Preferably, an absolute value of a threshold voltage is 0.2 V or less when a voltage applied to the bias electrode member is 0 V.

Preferably, an impurity concentration of the under-channel region is $1 \times 10^{18}$ cm$^{-3}$ or more.

Preferably, when a voltage applied to the bias electrode member is near 0 V, an absolute value of a rate of change in threshold voltage relative to a change in the applied voltage is 0.45 or more.

Preferably, when the bias electrode member is applied with a forward bias voltage and a reverse bias voltage which bias junctions formed between the drain region or the source region and the cap layer, between the drain region or the source region and the channel region, and between the drain region or the source region and the under-channel region in a forward direction and a reverse direction, respectively, the ratio of a rate of change in a threshold voltage relative to a change in an applied voltage under the application of the forward bias voltage to a rate of change in the threshold voltage relative to a change in the applied voltage under the application of the reverse bias voltage is 1.3 or more.

More preferably, the ratio of the rate of change in the threshold voltage relative to a change in the applied voltage under the application of the forward bias voltage to the rate of change of the threshold voltage relative to a change in the applied voltage under the application of the reverse bias voltage is 1.318 or more.

Preferably, a thickness of the cap layer is not less than 1 nm and not more than 10 nm.

The first semiconductor may be a semiconductor comprising SiGe as a major component while the second and third semiconductors may be each formed of Si.

The source region and the drain region may have p-type conductivity; and a p-channel may be formed in the channel region under a predetermined condition.

The first semiconductor may be a semiconductor comprising SiGeC as a major component while the second and third semiconductors may be each formed of Si.

The source region and the drain region may have n-type conductivity; and an n-channel may be formed in the channel region under a predetermined condition.

The under-channel region may be doped with boron.

An insulating layer may be provided under the semiconductor layer.

A complementary semiconductor device comprises: a first semiconductor device and a second semiconductor device, each of which is formed of the semiconductor device according to claim 1: wherein in the first semiconductor device, the source region and the drain region have p-type conductivity and a p-channel is formed in the channel region under a predetermined condition; and in the second semiconductor device, the source region and the drain region have n-type conductivity and an n-channel is formed in the channel region under a predetermined condition.

In each of the first and second semiconductor devices, the first semiconductor may be a semiconductor comprising SiGeC as a major component while the second and third semiconductors may be each formed of Si.

The foregoing and other objects, features and attendant advantages of the present invention will become apparent from the following detailed description of the preferred embodiments with reference to the accompanying drawings.

BRIEF DESCRIPTION OF THE DRAWINGS

FIG. 2(a) is a diagram showing an energy band in the case where the transistor is in its built-in state, FIG. 2(b) is a diagram showing an energy band in the case where the transistor is applied with a gate bias (in its operating state) and FIG. 2(c) is a diagram showing an energy band in the case where the transistor is not applied with the gate bias (in its stand-by state);

FIG. 3(a) is a diagram showing the result of simulation of a conventional Si-pVTMISFET and FIG. 3(b) is a diagram showing the result of simulation of the SiGe-pHVTMISFET of the present invention;

FIG. 8(a) is a diagram showing the Vg-Id characteristic in the case where the impurity concentration in the body region is $2 \times 10^{17}$ cm$^{-3}$ and FIG. 8(b) is a diagram showing the Vg-Id characteristic in the case where the impurity concentration in the body region is $5 \times 10^{17}$ cm$^{-3}$;

FIG. 9(a) is a diagram showing the Vg-Id characteristic in the case where the impurity concentration in the body region is $2 \times 10^{17}$ cm$^{-3}$, FIG. 9(b) is a diagram showing the Vg-Id characteristic in the case where the impurity concentration in the body region is $5 \times 10^{17}$ cm$^{-3}$ and FIG. 9(c) is a diagram showing the Vg-Id characteristic in the case where the impurity concentration in the body region is $1 \times 10^{18}$ cm$^{-3}$;

FIGS. 11(a) and 11(b) are diagrams showing the Vg-Id characteristic of the conventional Si-pVTMISFET and that of the SiGe-pHVTMISFET of the present invention under the condition where their threshold voltages are equalized to each other, with the substrate bias being used as a parameter; specifically, FIG. 11(a) is a diagram showing the Vg-Id characteristic of the conventional Si-pVTMISFET and FIG. 11(b) is a diagram showing the Vg-Id characteristic of the SiGe-pHVTMISFET of the present invention;

FIGS. 13(a), 13(b) and 13(c) are views showing the construction of a cHVTMIS device according to a second embodiment of the present invention; specifically, FIG. 13(a) is a sectional view showing the structure of the cHVTMIS device according to this embodiment, FIG. 13(b) is an energy band diagram showing a band state of a pHVTMISFET under application of a gate bias (in the operating state) and FIG. 13(c) is an energy band diagram showing a band state of an nHVTMISFET under application of a gate bias (in the operating state);

FIGS. 14(a), 14(b) and 14(c) are views showing the construction of a cHVTMIS device according to a third embodiment of the present invention; specifically, FIG. 14(a) is a sectional view showing the structure of the cHVTMIS device according to this embodiment, FIG. 14(b) is an energy band diagram showing a band state of a pHVTMISFET under application of a gate bias (in the operating state) and FIG. 14(c) is an energy band diagram showing a band state of an nHVTMISFET under application of a gate bias (in the operating state);

FIG. 17 is a table showing the values of respective plots in FIG. 10, substrate bias coefficients, and the ratio of each substrate bias coefficient under application of a forward bias to a corresponding substrate bias coefficient under application of a reverse bias.

DETAILED DESCRIPTION OF THE PREFERRED EMBODIMENTS

The present invention realizes a lowered threshold voltage $V_{th}$ and an increased substrate bias coefficient γ at the same time by utilizing a hetero barrier caused by band discontinuity developed at a heterojunction in the channel region, thereby providing VTMIS devices which operate at a higher driving current with a reduced power consumption. Hereinafter, embodiments of the present invention will be described one by one with reference to the accompanying drawings.

First Embodiment

Figure 1A:
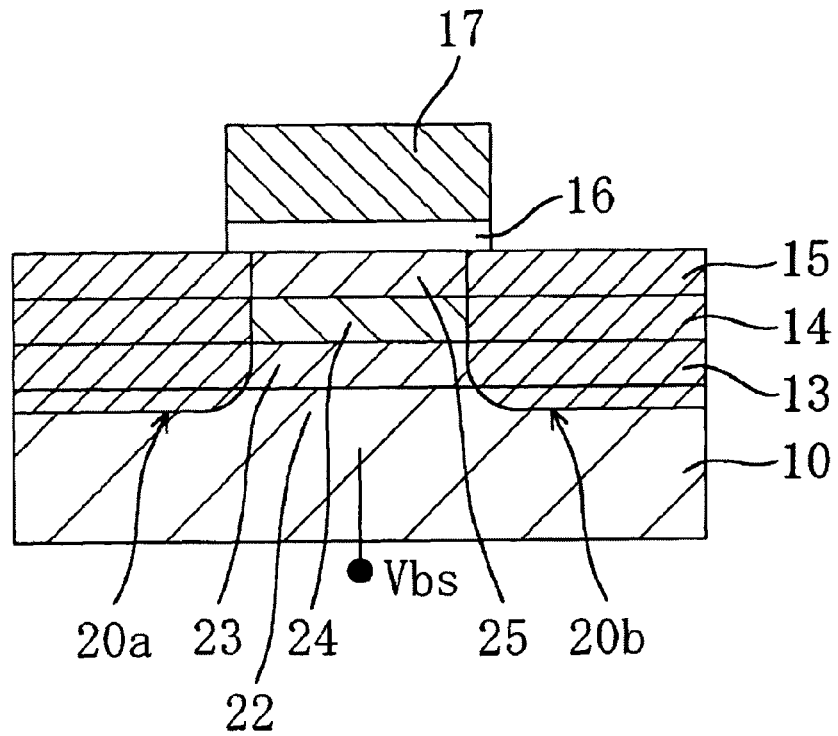
FIGS. 1(a) and 1(b) are a sectional view and a plan view, respectively, of a heterojunction type pHVTMISFET having a SiGe layer used as a channel according to a first embodiment of the present invention.
Figure 1B:
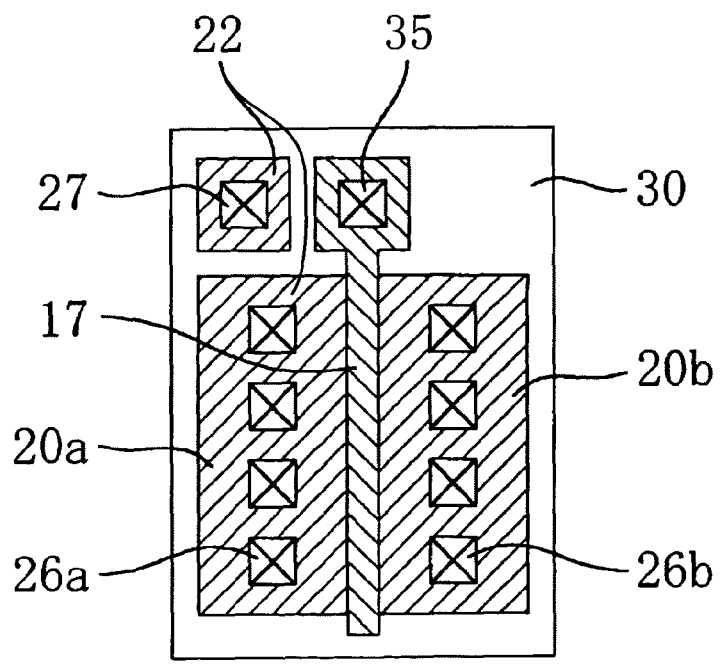

FIGS. 1(a) and 1(b) are a sectional view and a plan view, respectively, of a p-channel heterojunction type VTMIS transistor (hereinafter referred to as "pHVTMISFET) having a SiGe layer used as a channel according to a first embodiment of the present invention.

As shown in FIGS. 1(a) and 1(b), the pHVTMISFET according to this embodiment includes a p-type Si substrate 10, a Si buffer layer 13 of about 10 nm thickness epitaxially grown on the Si substrate 10 by the UHV-CVD process, a SiGe film 14 (Ge content: 30%) of about 15 nm thickness epitaxially grown on the Si buffer layer 13 by the UHV-CVD process, and a Si cap layer 15 of about 5 nm thickness epitaxially grown on the SiGe film 14 by the UHV-CVD process.

The pHVTMISFET further includes a gate insulator 16 of about 6 nm thickness consisting of a silicon oxide film provided on the Si cap layer 15, and a gate electrode 17 provided on the gate insulator 16. The gate electrode 17 is formed of polysilicon imparted with conductivity by doping with an impurity. A source region 20a and a drain region 20b, which contain a high concentration of a p-type impurity, are provided in regions of the Si buffer layer 13, the SiGe film 14 and the Si cap layer 15 situated on both sides of the gate electrode 17 in plan view and are surrounded by a device isolation region 30. A region of the Si substrate 10 defined between the source region 20a and the drain region 20b constitutes a Si body region 22 containing an n-type impurity, while a region of the Si buffer layer 13 located immediately above the Si body region 22 constitutes an n⁻Si region 23 containing a low concentration of the n-type impurity. A region of the SiGe film 14 defined between the source region 20a and the drain region 20b constitutes a SiGe channel region 24 containing a relatively low concentration of the n-type impurity, while a region of the Si cap layer 15 located immediately under the gate insulator 16 constitutes a Si cap region 25 containing a low concentration of the n-type impurity. While any one of the Si body region 22, Si region 23, SiGe channel region 24 and Si cap region 25 is herein described as containing the n-type impurity, it is sufficient for the n-type impurity to be contained in at least the Si body region 22 and Si region 23 that are located below the channel and, hence, the SiGe channel region 24 and the Si cap region 25 need not necessarily contain the n-type impurity.

The pHVTMISFET is provided with a gate contact connecting the gate electrode 17 to the wiring located thereabove, a source contact 26a electrically connecting the source region 20a to the wiring located thereabove, a drain contact 26b electrically connecting the drain region 20b to the wiring located thereabove, and a body contact 27 electrically connecting the Si body region 22 to the wiring located thereabove. The body contact 27 is a conductive member (bias electrode member) for applying a bias (voltage) to the Si body region 22 independently of other electrodes including the gate electrode 17. The channel length of the gate electrode 17 is about 0.3 μm.

The pHVTMISFET thus constructed according to the subject embodiment is capable of controlling the state of an energy band in a section cutting through the gate electrode 17, gate insulator 16, Si cap layer 25, SiGe channel region 24, n⁻Si layer 23 and Si body region 22 by means of a voltage applied to the gate electrode 17 (gate voltage $V_g$) and a voltage applied to the body region 22 through the body contact 27 (substrate bias $V_{bs}$).

Description will be made of the operation of the pHVTMISFET thus constructed.

In p-channel MISFETs in general, a negative voltage applied to the body region (Si body region 22 in the subject embodiment) serves as a forward substrate bias (bias in such a direction as to lower the threshold voltage) working in a forward direction with respect to a p-n junction (hereinafter referred to as "forward direction" simply) formed between the source region (source region 20a in the subject embodiment) and the body region. A positive voltage applied to the body region serves as a reverse substrate bias (bias in such a direction as to raise the threshold voltage) working in a reverse direction with respect to the pn junction (hereinafter referred to as "reverse direction" simply) formed between the source region and the body region. In n-channel MISFETs in general, a positive voltage applied to the body region serves as a forward substrate bias, while a negative voltage applied to the body region serves as a reverse substrate bias. Accordingly, in a p-channel MISFET, when a positive voltage is applied to the body region, the reverse substrate bias increases as the value of the positive voltage increases, while when a negative voltage is applied to the body region, the forward substrate bias increases as the absolute value of the negative voltage increases. In an n-channel MISFET, on the other hand, when a negative voltage is applied to the body region, the reverse substrate bias increases as the absolute value of the negative voltage increases, while when a positive voltage applied to the body region, the forward substrate bias increases as the value of the positive voltage increases.

Figure 15:
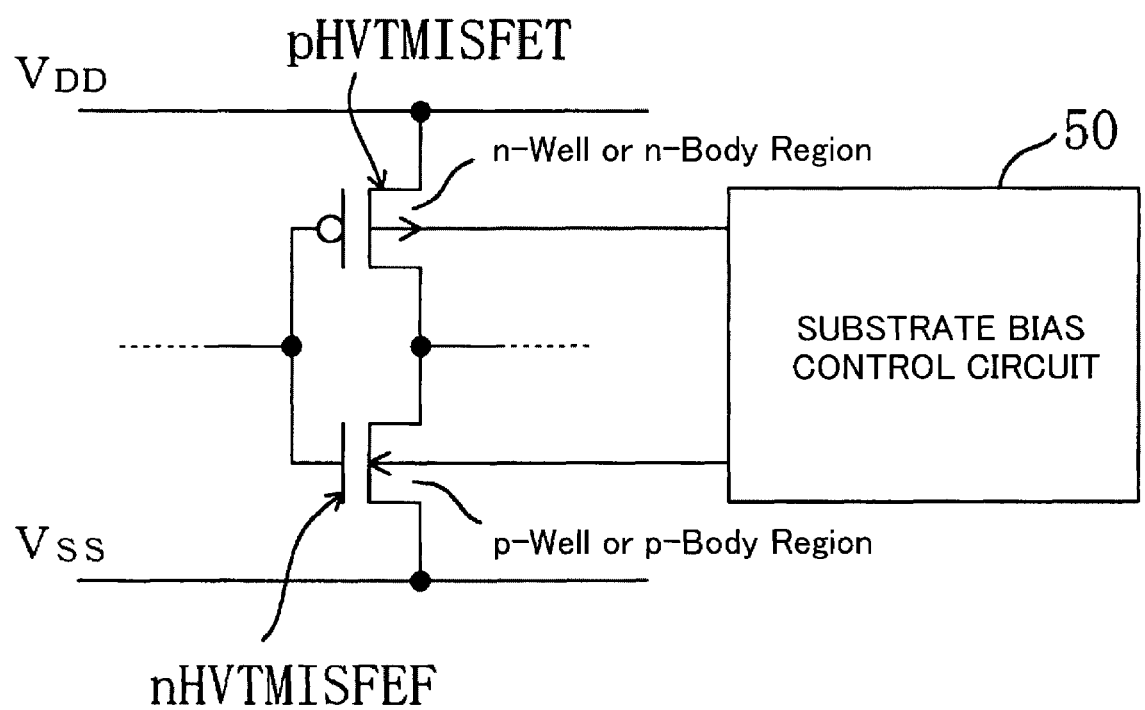
FIG. 15 is a block circuit diagram showing a circuit configuration for applying a substrate bias $V_{bs}$ to each of the nHVTMISFET and pHVTMISFET according to the third embodiment.

In the subject embodiment, a substrate bias control circuit 50 as shown in FIG. 15 applies a substrate bias $V_{bs}$ to the p-well (p-body region) of an n-channel heterojunction type VTMIS transistor (hereinafter referred to as "nHVTMIS-FET") through the body contact 27 shown in FIG. 1(b) so that the threshold voltage is lowered in the operating state or raised in the stand-by state. The region to be applied with the substrate bias $V_{bs}$ is sufficient to be located below the channel region and is a region called "well" or "body region". This region is a p-type region in an n-channel transistor, or an n-type region in a p-type region.

Figure 2A:
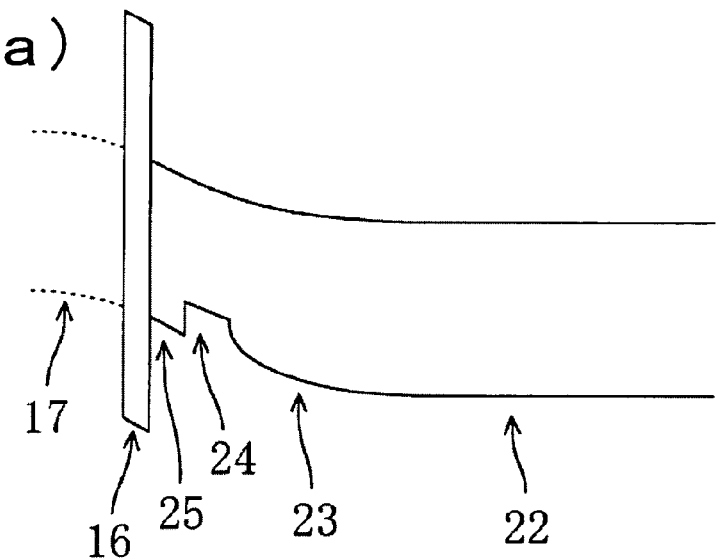
FIGS. 2(a), 2(b) and 2(c) are each a diagram showing an energy band in a section cutting through the gate electrode, gate insulator, Si cap layer, SiGe channel region, n$^-$Si layer and Si body region of the pHVTMISFET shown in FIGS. 1(a) and 1(b); specifically.
Figure 2B:
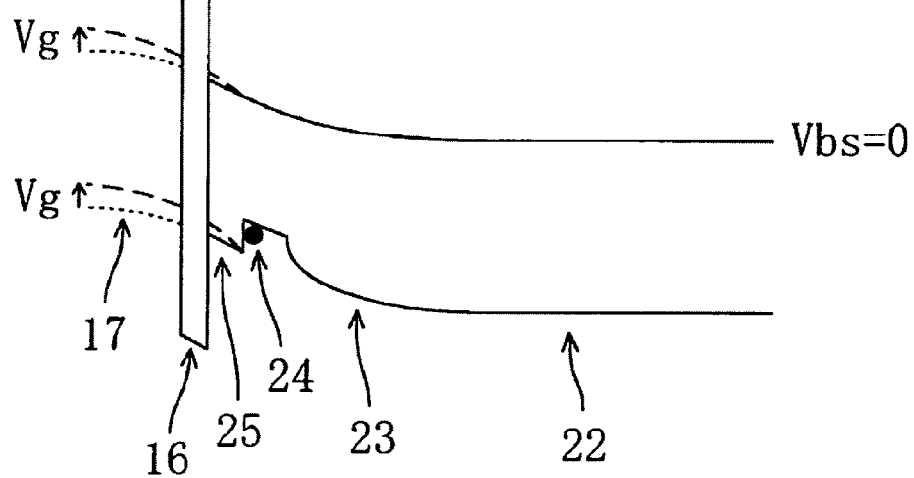
Figure 2C:
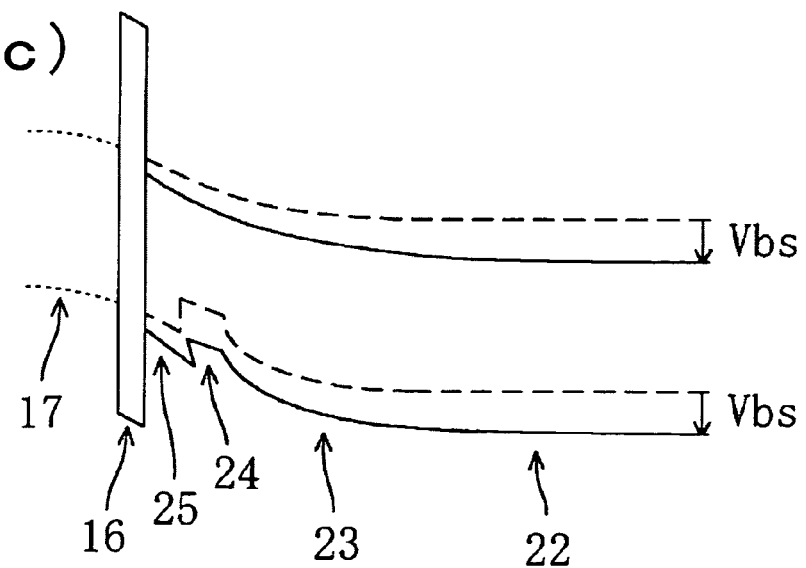

FIGS. 2(a), 2(b) and 2(c) are each a diagram showing an energy band obtained in a section cutting through the gate electrode 17, gate insulator 16, Si cap layer 25, SiGe channel region 24, n⁻Si layer 23 and Si body region 22 of the pHVTMISFET shown in FIGS. 1(a) and 1(b); specifically, FIG. 2(a) is a diagram showing an energy band in the case where the transistor is in its built-in state, FIG. 2(b) is a diagram showing an energy band in the case where the transistor is applied with a gate bias (in its operating state) and FIG. 2(c) is a diagram showing an energy band in the case where the transistor is not applied with the gate bias (in its stand-by state).

As shown in FIG. 2(a), when the transistor is in the built-in state, the band gap in the SiGe channel region 24 having a Ge content of 30% is about 220 meV less than that in the Si cap layer 25 and n⁻Si layer 23, so that a hetero barrier at a valence band edge, which is capable of confining holes, is developed between the SiGe channel region 24 and the Si cap layer 25 and between the SiGe channel region 24 and the n⁻Si layer 23. With the gate electrode 17 doped with a p-type impurity, the energy at a valence band edge in the portion of the SiGe channel region 24 contacting the Si cap layer 25 becomes particularly high in a bias-free state (in the built-in state), so that the valence band is formed with a dent portion, which is suitable for confinement of holes, in the portion of the SiGe channel region 24 adjoining the hetero barrier.

Thus, merely with application of a faint gate bias $V_g$, the band can be bent to form a p-channel in the portion of the SiGe channel region 24 adjoining the Si cap layer 25, thereby making it easy to lower the threshold voltage $V_{th}$. In the subject embodiment, the substrate bias $V_{bs}$ is 0 V in the operating state. The SiGe channel region 24 is formed at a location spaced from the gate insulator 16 by the thickness of the Si cap layer 25 and, hence, the SiGe-pHVTMISFET according to the present invention has a so-called "buried channel structure".

With a design to lower the threshold voltage $V_{th}$, the negative voltage to be applied to the gate electrode 17 for on-operation needs to be small enough to allow a design to be made such that an inversion layer can hardly be developed in the portion of the Si cap layer 25 adjoining the gate insulator 16. As a result, the so-called parasitic channel, which would otherwise be formed in other portion than the SiGe channel region 24, can be effectively prevented from being developed. Thus, the MISFET can be made operable at a lower voltage as well as at a higher speed by utilizing the fast mobility of holes, which is characteristic of the SiGe channel region 24.

As shown in FIG. 2(c), when the pHVTMISFET is in the stand-by state, the transistor is applied with a large positive substrate bias $V_{bs}$ (reverse bias), so that the valence band edge is largely bent downwardly. This means that the potential at the valence band edge in the channel region is increased relative to the potential at the valence band edge in the source drain region, that is, the barrier is heightened. Accordingly, the threshold voltage, which is a voltage to be applied to the gate electrode 17 to turn the pHVTMISFET on, is increased, resulting in reduced leakage current (off-leakage current) when the gate bias is 0 V.

It should be noted that the pHVTMISFET may be of a construction such that the threshold voltage is lowered in the operating state by application of a forward (negative) substrate bias $V_{bs}$ or raised in the stand-by state by application of a substrate bias $V_{bs}$ of 0 V.

Next, description will be made of the substrate bias coefficient. In the subject embodiment, the substrate bias coefficient γ, which is the ratio of a change in threshold voltage $V_{th}$ to a change in substrate bias $V_{bs}$, can be increased even if the threshold voltage $V_{th}$ is lowered. Therefore, the threshold voltage of the MIS transistor can be shifted largely in response to the change in the substrate bias. This has been proved from the following data.

Figure 3A:
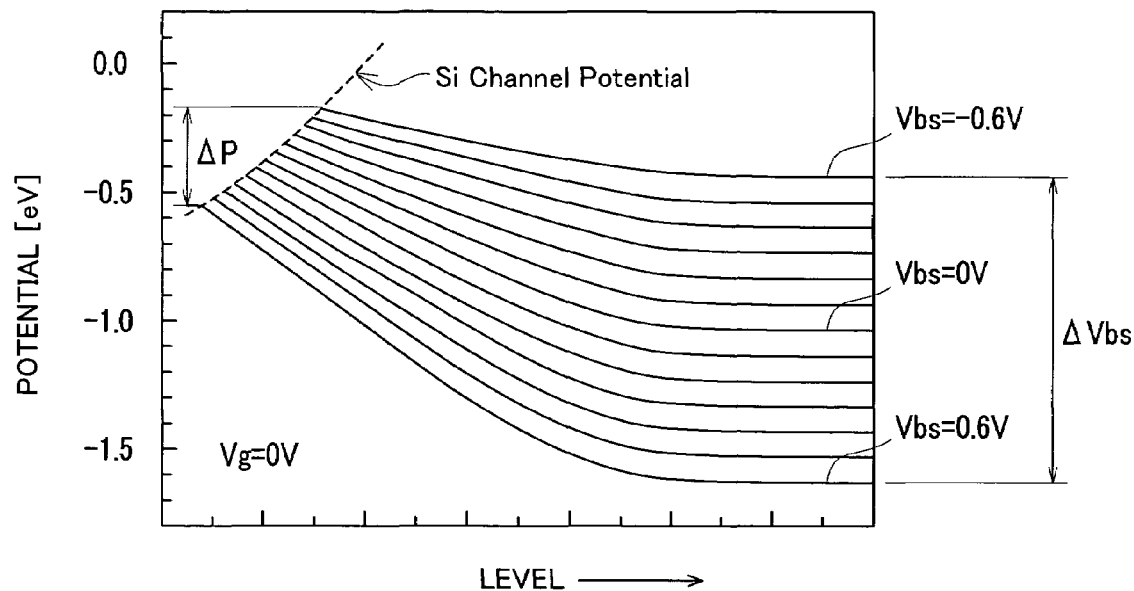
FIGS. 3(a) and 3(b) are each a diagram showing the result of simulation of the potential at a valence band edge in a pVTMISFET; specifically.
Figure 3B:
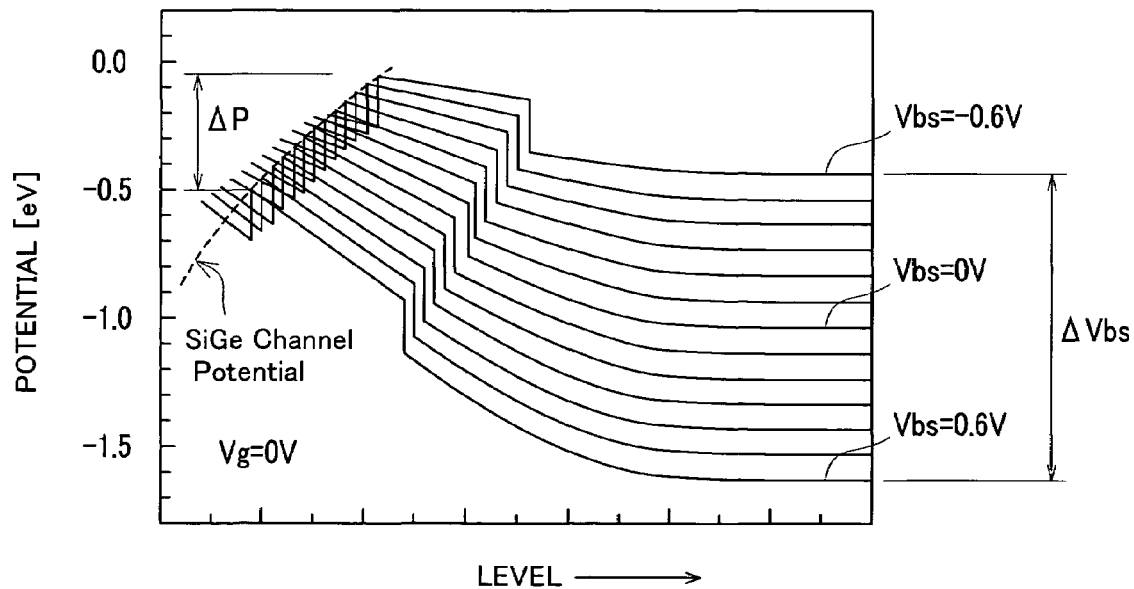

FIGS. 3(a) and 3(b) are each a diagram showing the result of simulation of the potential at a valence band edge in a pVTMISFET; specifically, FIG. 3(a) is a diagram showing the result of simulation obtained from a conventional Si-pVTMISFET and FIG. 3(b) is a diagram showing the result of simulation obtained from the SiGe-pHVTMISFET of the present invention.

Each of FIGS. 3(a) and 3(b) plots the depthwise level from the top surface of the substrate as the abscissa and the potential as the ordinate. Note that in a p-channel MISFET the potential (potential relative to the transit of holes) increases as it grows toward the negative side since the holes work as carriers. In both of the conventional Si-pVTMISFET and the SiGe-pHVTMISFET according to the present invention, the impurity concentration in the body region is $1 \times 10^{18}$ cm⁻³, the substrate bias $V_{bs}$ varies from 0.6 V (reverse bias) to −0.6 V (forward bias), and the gate bias $V_g$ is 0 V. In each of FIGS. 3(a) and 3(b), though the ends of curves representing valence band edges are, in fact, located on the same level in terms of the abscissa, the ends of the curves representing the valence band edges are described as shifted for easy viewing. The dotted lines in FIGS. 3(a) and 3(b) plot the potential at the Si channel and the potential at the SiGe channel, respectively.

As can be seen from FIGS. 3(a) and 3(b), the potential at the SiGe channel of the pHVTMISFET according to the present invention is lower than the potential at the Si channel formed in a region adjacent the interface with the gate insulator of the conventional Si-pVTMISFET. This is attributed to the band gap of SiGe smaller than that of Si.

Further, the potential gradient $\Delta P/\Delta V_{bs}$ (=about 0.45/1.0) of the SiGe channel shown in FIG. 3(b) is larger than the potential gradient $\Delta P/\Delta V_{bs}$ (=about 0.40/1.0) of the Si channel shown in FIG. 3(a). That is, the dependency of a change in the potential at the valence band edge in the SiGe channel on the substrate bias $V_{bs}$ is higher than that in the Si channel. This means that the SiGe-pHVTMISFET has a greater substrate bias coefficient γ than the Si-pVTMISFET. This can be reasoned as follows. That is, the conventional Si-pVTMISFET has the Si channel formed in a portion adjoining the gate insulator, stated otherwise, in a portion proximate to the top surface of the semiconductor substrate, while the pHVTMISFET according to the present invention has a so-called buried channel structure in which the SiGe channel is formed at a location spaced from the gate insulator by the thickness of the Si cap layer and, hence, a greater influence is exerted on the SiGe channel by the substrate bias $V_{bs}$.

Figure 4:
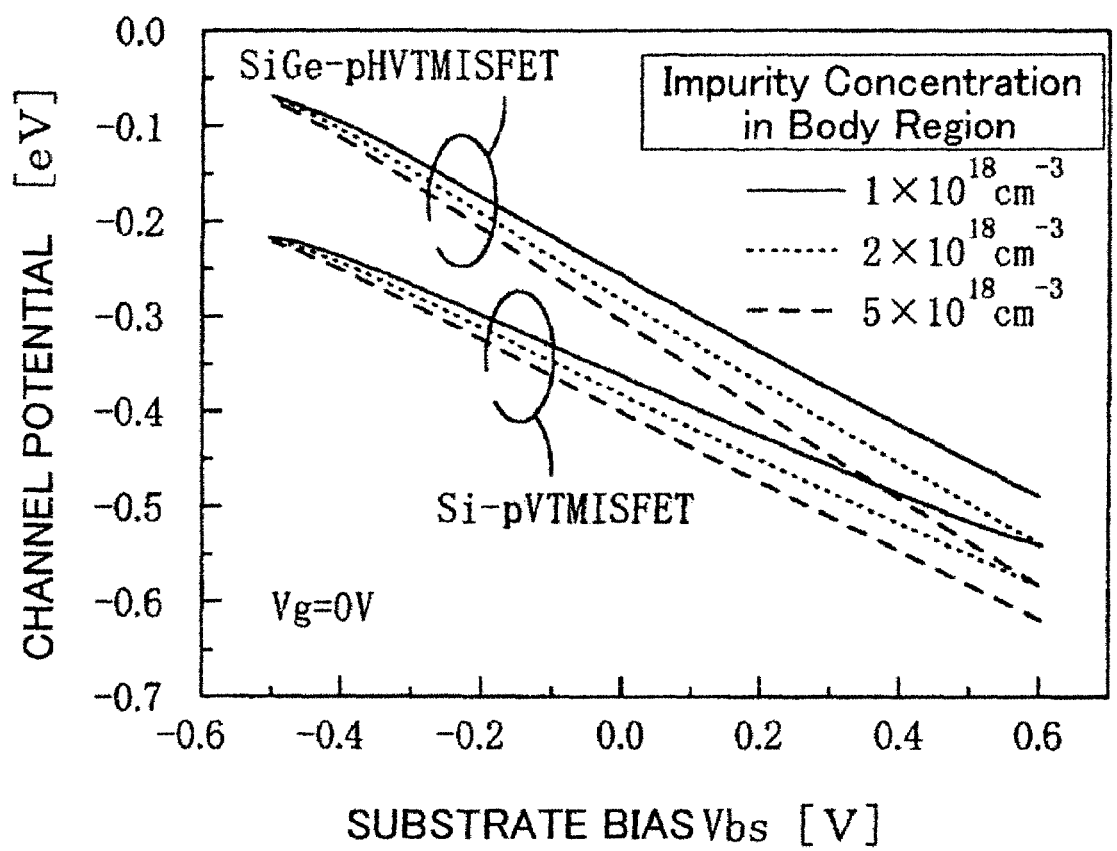
FIG. 4 is a diagram showing the result of simulation of dependency of the channel potential on the substrate bias in each of the Si-pVTMISFET and the SiGe-pHVTMISFET.

FIG. 4 is a diagram showing the result of simulation of dependency of the channel potential on the substrate bias in each of the conventional Si-pVTMISFET and the SiGe-pHVTMISFET according to the present invention. FIG. 4 plots the substrate bias $V_{bs}$ as the abscissa and the channel potential as the ordinate. Note that since holes work as carriers in a p-channel MISFET, the potential (potential relative to the transit of holes) increases as it grows toward the negative side. In both of the conventional Si-pVTMISFET and the SiGe-pHVTMISFET according to the present invention, the impurity concentration in the body region is varied to have values of $1\times10^{18}$ cm$^{-3}$, $2\times10^{18}$ cm$^{-3}$ and $5\times10^{18}$ cm$^{-3}$ and the gate bias $V_g$ is 0 V.

As clearly shown in FIG. 4, a change in channel potential (the gradient of each line) relative to a change in substrate bias $V_{bs}$ in the SiGe-pHVTMISFET of the present invention is larger than that in the conventional Si-pVTMISFET. That is, by employing the buried-type SiGe heterojunction channel structure in a VTMISFET instead of the conventional Si channel structure, a remarkable effect can be obtained of realizing both the lowering of threshold voltage $V_{th}$ and the increasing of substrate bias coefficient γ, which are in tradeoff relation to each other in the prior art. Stated emphatically again, the present invention has been made based on the knowledge that a buried channel structure is more susceptible to substrate bias $V_{bs}$ than other conventional channel structures with attention being paid to the high-speed operation performance that is characteristic of a SiGe heterojunction channel structure. It is the buried-type SiGe heterojunction channel structure employed by the present invention that made it possible for the first time to resolve the problem essential to the prior art that the lowering of threshold voltage $V_{th}$ and the increasing of substrate bias coefficient γ are in tradeoff relation to each other.

Also, as can be understood from the fact that the potential of the SiGe channel except a reversely biased region that is strongly biased with the substrate bias $V_{bs}$ ($V_{bs}$ is 0.3 V or more) is lower than that of the Si channel, the threshold voltage $V_{th}$ of the SiGe-pHVTMISFET is lower than that of the Si-pVTMISFET and, hence, the threshold voltage $V_{th}$ can be kept low even when the impurity concentration of the body region is rendered high. It can also be understood from these facts that the SiGe-pHVTMISFET according to the present invention can realize a still larger substrate bias coefficient γ and is less affected by the short channel effect.

While the Si cap layer 25 has a thickness of 5 nm in the subject embodiment, the thickness of the Si cap layer 25 is preferably within the range of not less than 1 nm and not more than 10 nm. Reasons therefor include: the Si cap layer 25 needs to have a thickness of about 1 nm for the gate insulator to be formed stably by thermal oxidation of the Si cap layer 25; if the Si cap layer is too thick, the SiGe channel region 24 becomes remoter from the gate insulator 16, so that the degree of lowering of the threshold voltage $V_{th}$ is decreased, though the substrate bias coefficient γ is increased; the short channel effect might become conspicuous.

Although the SiGe channel region 24 preferably has a higher Ge content in lowering the threshold voltage $V_{th}$ to a greater degree, too high a Ge content makes a critical film thickness impractically thin, the critical thickness being a thickness critical to allowing strain caused by Si—SiGe lattice mismatch to be relaxed. Thus, the Ge content in the SiGe channel region is preferably within the range of not less than 15% and not more than 40%. The thickness of the SiGe channel region 24 is preferably within the range of not less than 3 and not more than 20 nm. As the thickness of the Si buffer layer 13 increases, the substrate bias coefficient γ decreases and the threshold voltage $V_{th}$ lowers. Since too thick Si buffer layer 13 causes the threshold voltage $V_{th}$ to lower too much, the thickness of the Si buffer layer 13 is preferably not less than 0 nm and not more than 20 nm.

The following description will compare the basic characteristics, namely characteristics under the condition where the substrate bias $V_{bs}$ is not applied, of the SiGe-HVTMISFET of the subject embodiment to those of the conventional Si-VTMISFET.

Figure 5:
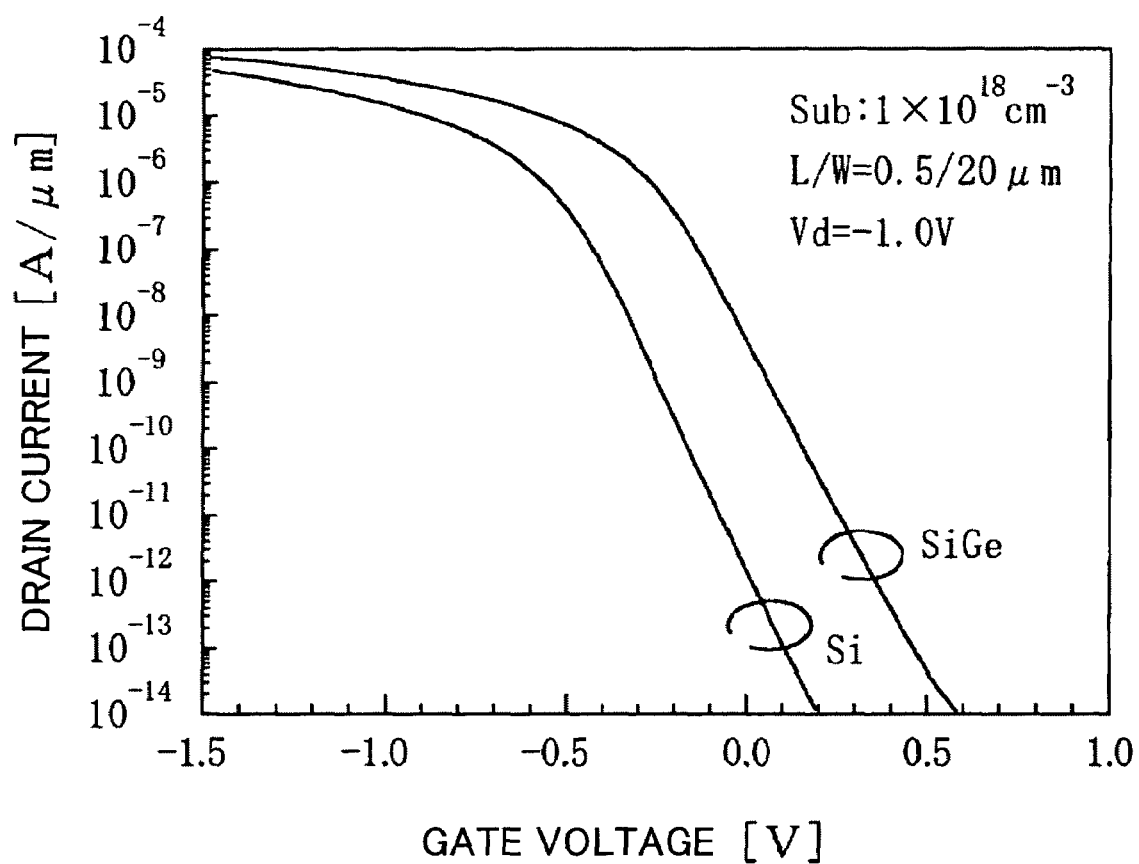
FIG. 5 is a diagram showing the Vg-Id characteristic of the Si-pVTMISFET and that of the SiGe-pHVTMISFET for comparison.
Figure 16:
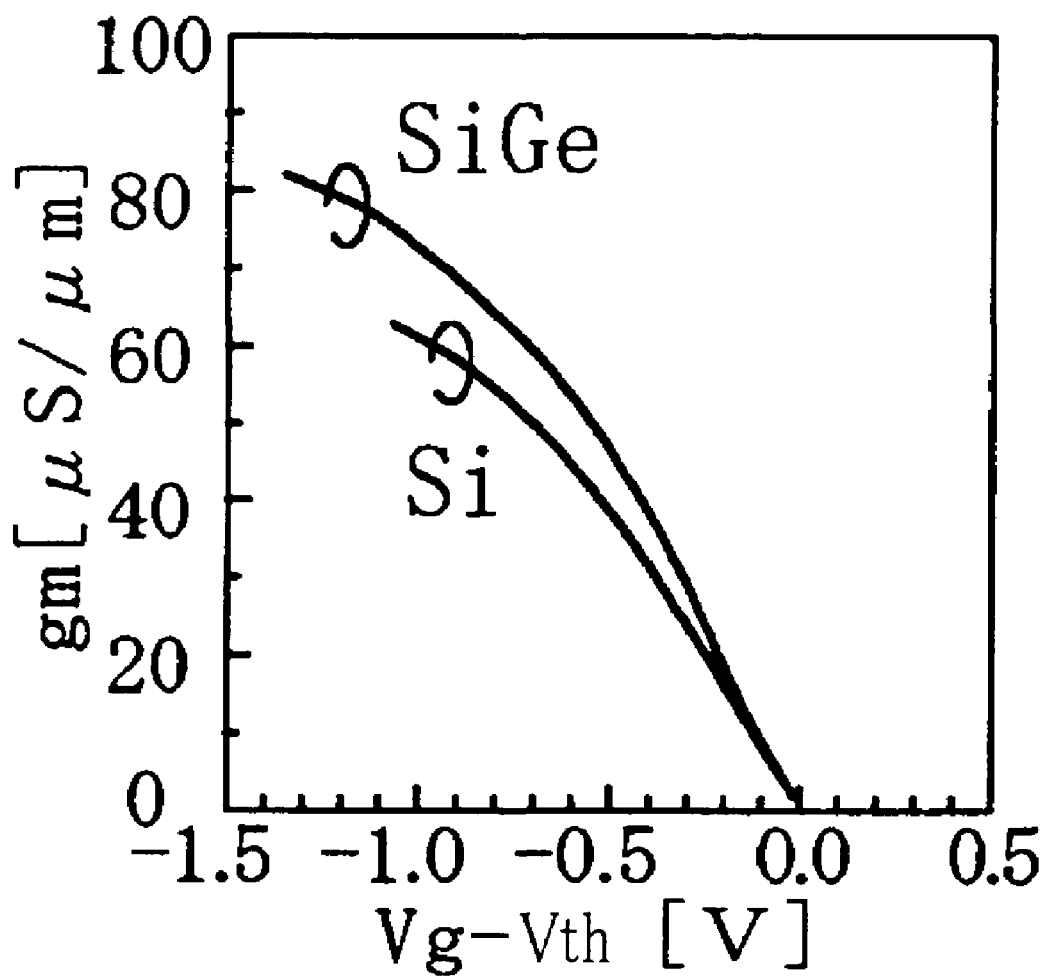
FIG. 16 is a diagram showing changes in mutual conductance with varying voltage difference between the gate voltage and the threshold voltage.

FIG. 5 is a diagram showing the Vg-Id characteristic of the conventional Si-pVTMISFET and that of the SiGe-pHVTMISFET of the present invention for comparison, and FIG. 16 is a diagram showing changes in mutual conductance with varying gate overdrive voltage ($V_g$-$V_{th}$). Referring to FIG. 5, in each of the transistors the impurity concentration in the substrate is $1\times10^{18}$ cm$^{-3}$ and the substrate bias $V_{bs}$ is 0 V. As has already been described, the SiGe-pHVTMISFET is found to exhibit a lowered threshold voltage $V_{th}$. Also, as can be seen from FIG. 16, the SiGe-pHVTMISFET exhibits an increased mutual conductance (gm). This reflects the hole mobility in the SiGe channel higher than that in the Si channel.

Figure 6A:
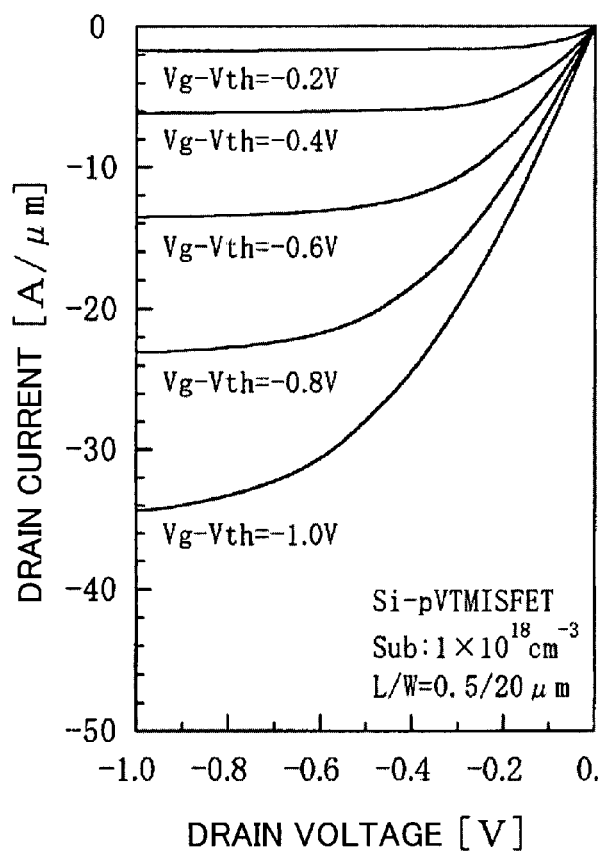
FIGS. 6(a) and 6(b) are diagrams showing changes in the Vg-Id characteristic of the Si-pVTMISFET and those in the Vg-Id characteristic of the SiGe-pHVTMISFET, respectively, for comparison.
Figure 6B:
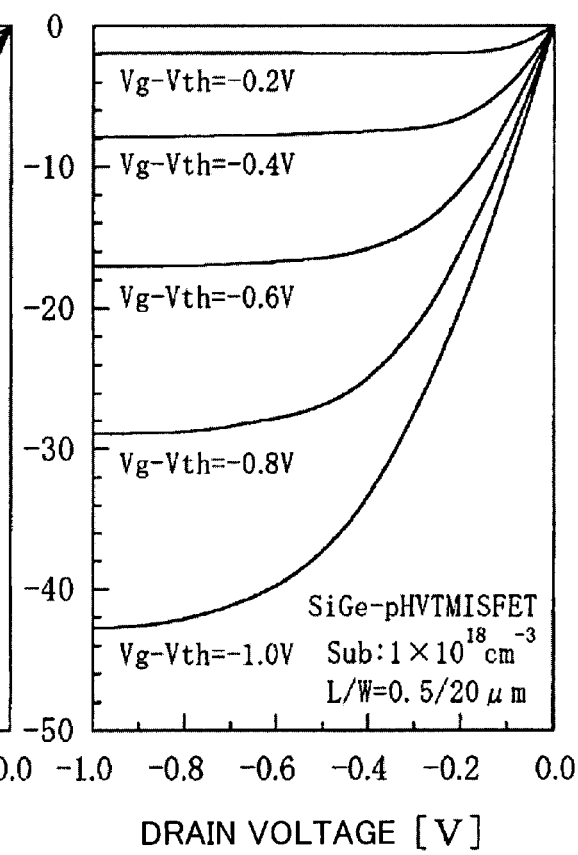

FIGS. 6(a) and 6(b) are diagrams showing changes in the Vg-Id characteristic of the conventional Si-pVTMISFET and those in the Vg-Id characteristic of the SiGe-pHVTMISFET of the present invention, respectively, for comparison. In each of FIGS. 6(a) and 6(b), the gate overdrive voltage ($V_g$-$V_{th}$) is varied as a parameter. As can be seen from these figures, a saturation drain current obtained by the SiGe-pHVTMISFET of the present invention with the gate overdrive voltage ($V_g$-$V_{th}$) exceeding the threshold voltage $V_{th}$ is about 1.2 times as large as that obtained by the conventional Si-pVTMISFET.

Figure 7:
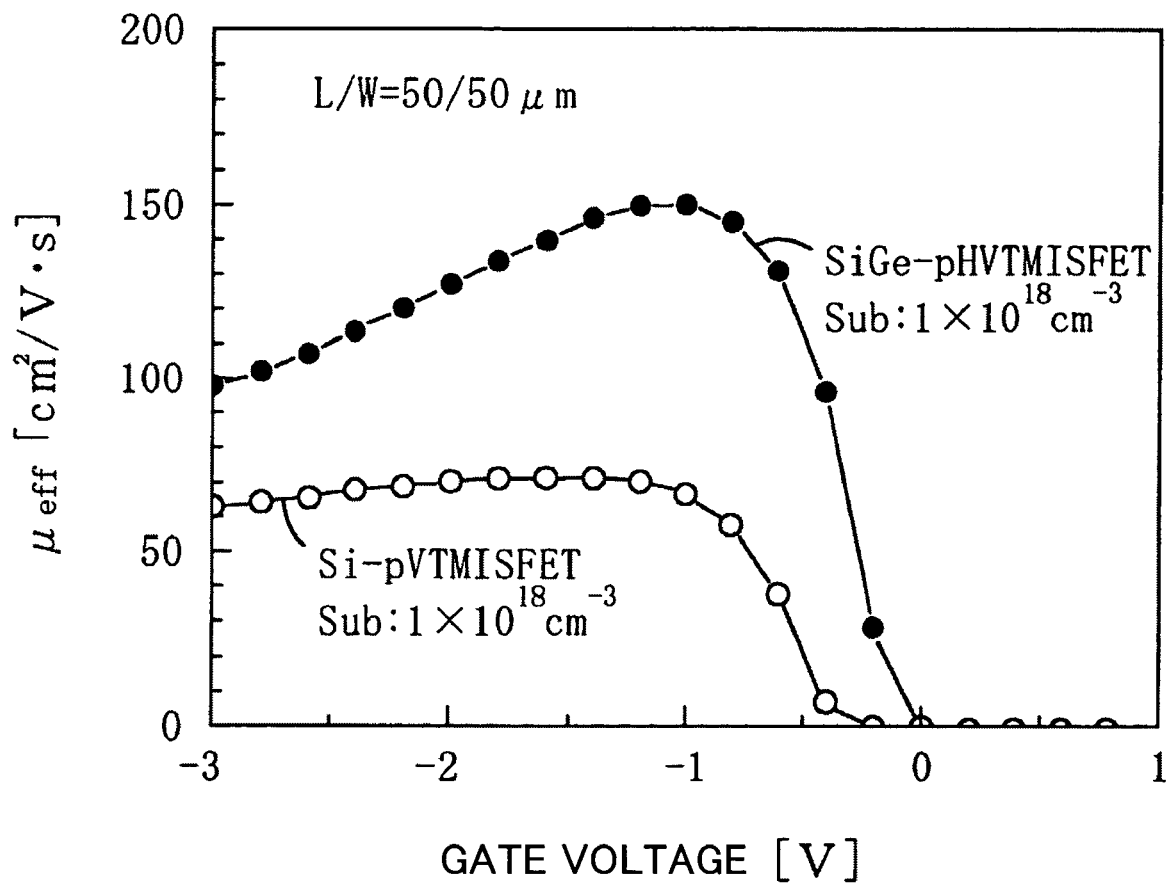
FIG. 7 is a diagram showing the effective hole mobility under application of a low electric field in the Si-pVTMISFET and that in the SiGe-pHVTMISFET for comparison.

FIG. 7 is a diagram showing the effective hole mobility (μeff) under application of a low electric field in the conventional Si-pVTMISFET and that in the SiGe-pHVTMISFET of the present invention for comparison. As shown, the SiGe-pHVTMISFET of the present invention exhibits hole mobility about twice as high as that of the conventional Si-pVTMISFET. Thus, the use of SiGe as a channel in a VTMISFET makes it possible not only to lower the threshold voltage $V_{th}$ and increase the substrate bias coefficient γ but also to obtain a high hole mobility, thereby exhibiting the aforementioned effect of improving the mutual conductance (gm) and increasing the saturation drain current. Hence, the use of SiGe as a channel is very effective in making the transistor operable at a higher speed.

Figure 8A:
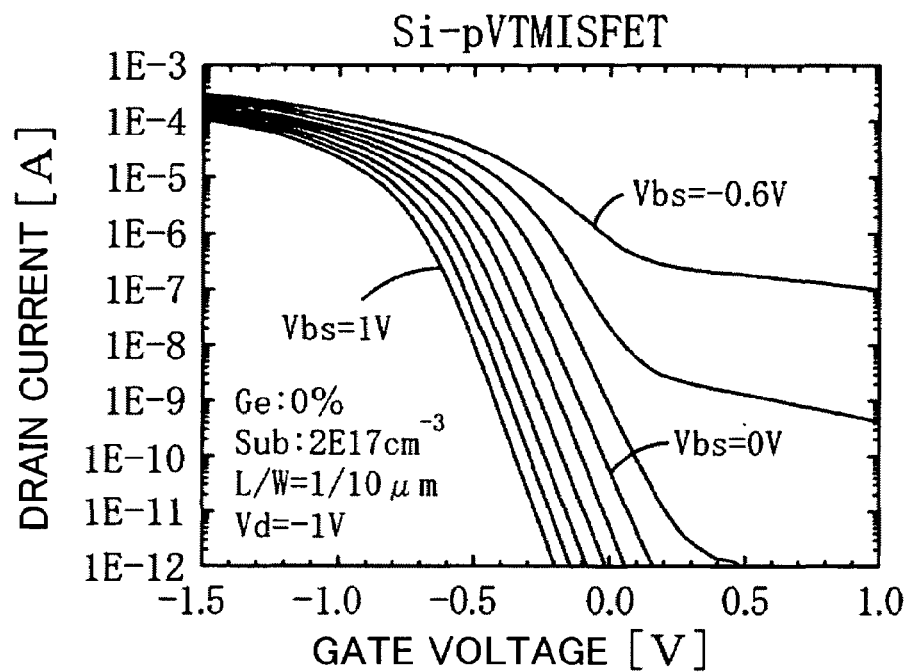
FIGS. 8(a) and 8(b) are diagrams showing Vg-Id characteristics of the conventional Si-pVTMISFET; specifically.
Figure 8B:
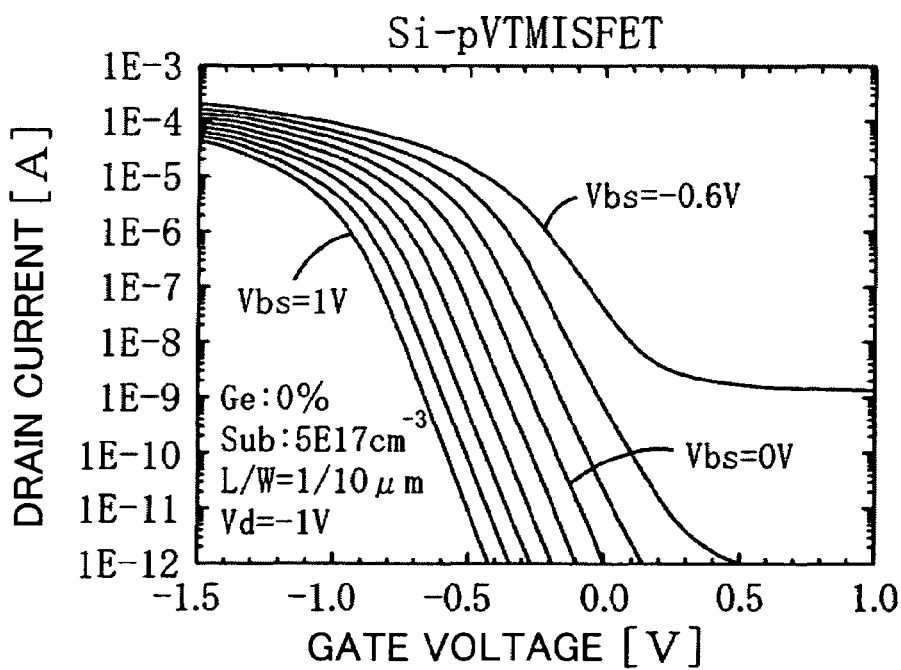
Figure 9A:
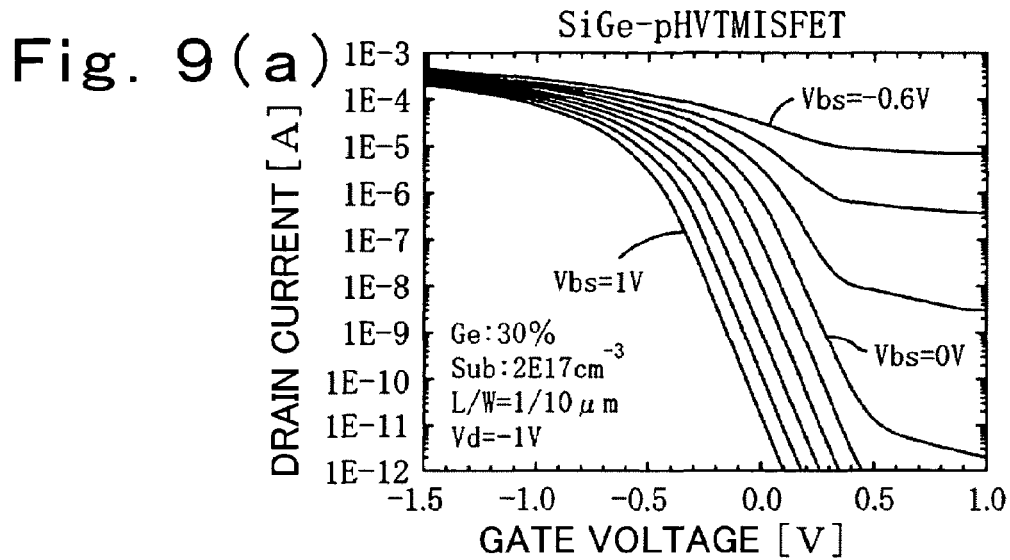
FIGS. 9(a) to 9(c) are diagrams showing Vg-Id characteristics of the SiGe-pHVTMISFET of the present invention; specifically.
Figure 9B:
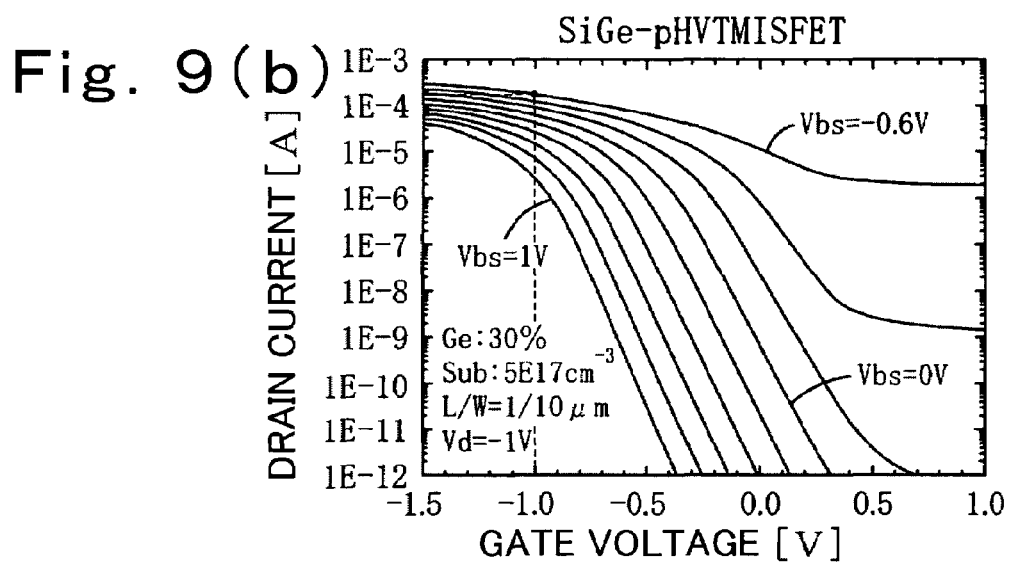
Figure 9C:
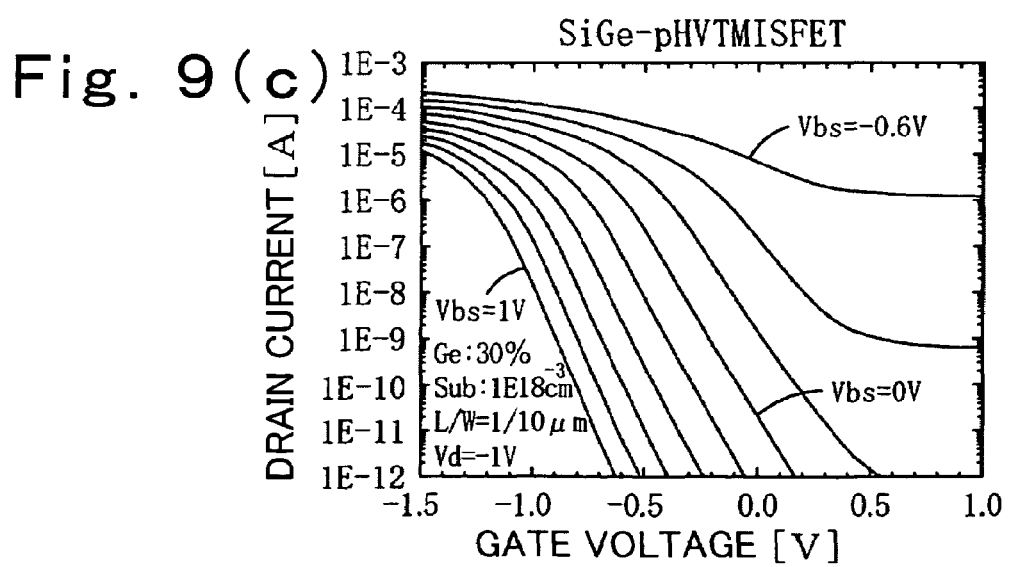

FIGS. 8(a) and 8(b) are diagrams showing Vg-Id characteristics of the conventional Si-pVTMISFET; specifically, FIG. 8(a) is a diagram showing the Vg-Id characteristic in the case where the impurity concentration in the body region is $2\times10^{17}$ cm$^{-3}$ and FIG. 8(b) is a diagram showing the Vg-Id characteristic in the case where the impurity concentration in the body region is $5\times10^{17}$ cm$^{-3}$. FIGS. 9(a) to 9(c) are diagrams showing Vg-Id characteristics of the SiGe-pHVTMISFET of the present invention; specifically, FIG. 9(a) is a diagram showing the Vg-Id characteristic in the case where the impurity concentration in the body region is $2\times10^{17}$ cm$^{-3}$, FIG. 9(b) is a diagram showing the Vg-Id characteristic in the case where the impurity concentration in the body region is $5\times10^{17}$ cm$^{-3}$ and FIG. 9(c) is a diagram showing the Vg-Id characteristic in the case where the impurity concentration in the body region is $1\times10^{18}$ cm$^{-3}$.

FIGS. 8(a) and 8(b) and FIGS. 9(a) to 9(c) plot Vg-Id characteristic curves in the case where the substrate bias $V_{bs}$ varies stepwise by 0.2 V from −0.6 V to 1 V. As can be seen from FIG. 9(b) for example, by controlling the substrate bias $V_{bs}$ so that it assumes −0.6 V in the operating state of the SiGe-pHVTMISFET and 0 V in the stand-by state, there can be obtained a high drive current (drain current Id=about $1\times10^{-4}$ A when the gate voltage $V_g$=−1.0 V) in the operating state and a high threshold voltage $V_{th}$ ($V_{th}$=about 0.3 V) in the stand-by state. As well, by controlling the substrate bias $V_{bs}$ so that it assumes 0 V in the operating state of the SiGe-pHVTMISFET and 1 V in the stand-by state, there can also be obtained a high drive current in the operating state and a high threshold voltage $V_{th}$ in the stand-by state.

It can be understood from comparisons among FIGS. 8(a) and 8(b) and FIGS. 9(a) to 9(c) that when the SiGe-pHVTMISFET of the present invention and the conventional Si-pVTMISFET have equal impurity concentration in their respective body regions and are applied with equal substrate bias $V_{bs}$, the SiGe-pHVTMISFET of the present invention has a lower threshold voltage than the conventional Si-pVTMISFET and exhibits a change in Vg-Id characteristic relative to a change in substrate bias $V_{bs}$ within a larger range the conventional Si-pVTMISFET. For example, according to the comparison between FIG. 8(b) and FIG. 9(b) where the impurity concentration in respective body region is $5\times10^{17}$ cm$^{-3}$ and the substrate bias $V_{bs}$ is 0 V, the threshold voltage $V_{th}$ of the conventional Si-pVTMISFET is about 0.0 V, whereas that of the SiGe-pHVTMISFET of the present invention is about 0.3 V. Since the threshold voltage of a p-channel MISFET becomes higher as the absolute value thereof increases toward the negative side, the threshold voltage of the SiGe-pHVTMISFET of the present invention is lower than that of the conventional Si-pVTMISFET. Further, according to the comparison between FIG. 8(b) and FIG. 9(b) for example, the Vg-Id characteristic curves corresponding to respective substrate biases $V_{bs}$ in FIG. 9(b) directed to the SiGe-pHVTMISFET of the present invention show a wider expansion toward the lower right-hand side in the drawing than do those in FIG. 8(b).

In this way, the provision of a SiGe channel in a VTMISFET was proved to enable the threshold voltage $V_{th}$ to lower and allow an increased threshold voltage shift (substrate bias coefficient γ) relative to substrate bias $V_{bs}$ to occur.

The threshold voltage $V_{th}$ of the SiGe-pHVTMISFET of the present invention lowers markedly when a forward substrate bias $V_{bs}$ is applied. This means that application of a forward substrate bias $V_{bs}$ brings about an increased drain current Id. Such a large reduction in threshold voltage $V_{th}$ caused by application of a forward substrate bias is attributed to a low potential relative to transit of holes in the SiGe channel region as viewed from the source side due to SiGe having a smaller band gap than Si.

As apparent from the fact that the Vg-Id characteristic curves corresponding to respective substrate biases $V_{bs}$ in FIG. 8(b) show a wider expansion toward the lower right-hand side in the drawing than do those in FIG. 8(a) and from the fact that the Vg-Id characteristic curves corresponding to respective substrate biases $V_{bs}$ show an expansion toward the lower right-hand side in the drawing that increases in the order of FIG. 9(a), FIG. 9(b) and FIG. 9(c), the SiGe-pHVTMISFET of the present invention as well as the conventional Si-pVTMISFET exhibits an increase in substrate bias coefficient γ as the impurity concentration in the body region is raised. Further, the difference in substrate bias coefficient γ between the SiGe-pHVTMISFET of the present invention and the conventional Si-pVTMISFET becomes more significant as the impurity concentration in the body region is raised.

Figure 10:
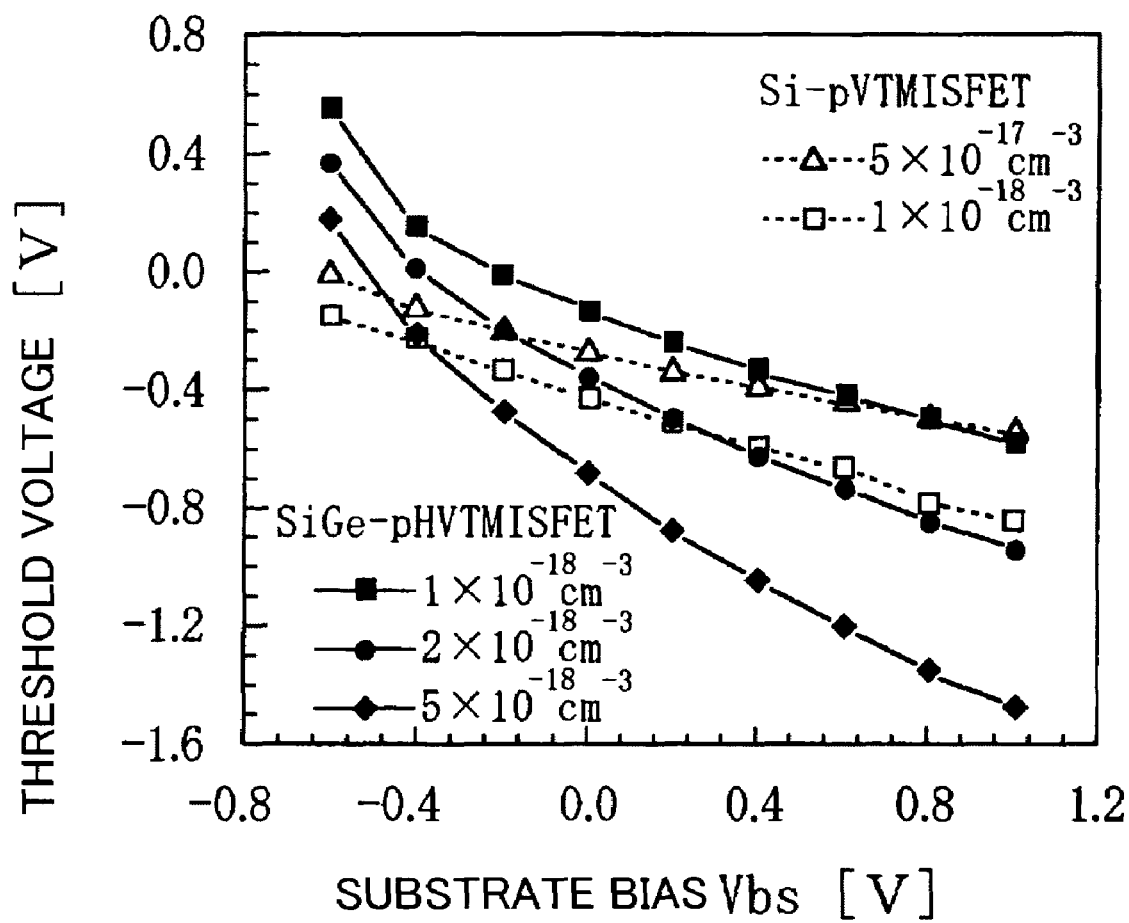
FIG. 10 is a diagram showing dependency of the threshold voltage on the substrate bias in each of the Si-pVTMISFET and the SiGe-pHVTMISFET.

FIG. 10 is a diagram showing dependency of the threshold voltage on the substrate bias in each of the conventional Si-pVTMISFET and the SiGe-pHVTMISFET of the present invention with the impurity concentration in the body region used as a parameter, and FIG. 17 is a table showing the values of respective plots in FIG. 10, substrate bias coefficients, and the ratio of each substrate bias coefficient under application of forward bias to a corresponding substrate bias coefficient under application of reverse bias. In FIG. 17, substrate bias coefficient γ1 under application of reverse bias is a value obtained by dividing the voltage difference between the value of threshold voltage $V_{th}$ in the case where the substrate bias $V_{bs}$ is 0 V and that in the case where the substrate bias $V_{bs}$ is −0.4 V by the amount of a change in substrate bias $V_{bs}$ taken place during the interval in which the substrate bias $V_{bs}$ changes from 0 V to −0.4 V; that is, substrate bias coefficient γ1 is a mean substrate bias coefficient in this interval. Substrate bias coefficient γ2 under application of forward bias is a value obtained by dividing the voltage difference between the value of threshold voltage $V_{th}$ in the case where the substrate bias $V_{bs}$ is −0.4 V and that in the case where the substrate bias $V_{bs}$ is 0 V by the amount of a change in substrate bias $V_{bs}$ taken place during the interval in which the substrate bias $V_{bs}$ changes from −0.4 V to 0 V; that is, substrate bias coefficient γ2 is a mean substrate bias coefficient in the interval of interest. The substrate bias coefficient ratio is the ratio of substrate bias coefficient γ2 under application of forward bias to substrate bias coefficient γ1 under application of reverse bias.

As apparent from FIGS. 10 and 17, with rising impurity concentration in the body region, the threshold voltage $V_{th}$ rises and the substrate bias coefficient γ (the gradient of each curve shown in FIG. 10) increases. Also, it can be well understood from these figures that the provision of the buried-type SiGe channel makes it possible to lower the threshold voltage and increase the substrate bias coefficient γ2. Further, the threshold voltage $V_{th}$ of the SiGe-pHVTMISFET lowers (varies toward the positive side) markedly particularly when a forward substrate bias (negative voltage) is applied. This is attributed to the potential of the SiGe channel lower than that of the Si channel as described earlier and hence indicates that the SiGe-pHVTMISFET has a higher drive current.

Here, the aforementioned facts are described more specifically by means of values. As apparent from FIG. 17, in the conventional Si-pVTMISFET an absolute value of the threshold voltage is a minimum of 0.273 (impurity concentration in the body region: $5\times10^{17}$ cm$^{-3}$) when the substrate bias $V_{bs}$ is 0 V, while in contrast in the SiGe-pHVTMISFET of the present invention the absolute value of the threshold voltage is a minimum of 0.132 (impurity concentration in the body region: $1\times10^{18}$ cm$^{-3}$) when the substrate bias $V_{bs}$ is 0 V. That is, it is the present invention that realized for the first time a VTMISFET exhibiting the threshold voltage that has an absolute value of not more than 0.2 V when the substrate bias $V_{bs}$ is 0 V. Conversely, if the threshold voltage of the SiGe-pHVTMISFET of the present invention under application of the substrate bias $V_{bs}$ of 0 V is equalized to that of the conventional Si-pVTMISFET, the substrate bias coefficient γ can be increased by increasing the impurity concentration in the body region. Specifically, the SiGe-pHVTMISFET of the present invention can have an impurity concentration of $1\times10^{18}$ cm$^{-3}$ or more in its body region, as apparent from FIG. 17.

In the conventional Si-pVTMISFET an absolute value of a substrate bias coefficient γ0 is a maximum of 0.440 (impurity concentration in the body region: $1\times10^{18}$ cm$^{-3}$) when the substrate bias $V_{bs}$ is near 0 V, while in contrast in the SiGe-pHVTMISFET of the present invention the absolute value of the substrate bias coefficient γ0 is at least 0.573 (impurity concentration in the body region: $1\times10^{18}$ cm$^{-3}$) when the substrate bias $V_{bs}$ is near 0 V. That is, it is the present invention that realized for the first time a VTMISFET having a substrate bias coefficient γ0 that has an absolute value of not less than 0.45 V when the substrate bias $V_{bs}$ is near 0 V. Thus, the VTMISFET of the present invention is capable of shifting the substrate bias $V_{bs}$ more largely than the conventional VTMISFET, whereby on-current can be enhanced by lowering the threshold voltage in the operating state of the VTMISFET, while subthreshold leakage current (off-leakage current) can be reduced by raising the threshold voltage in the stand-by state of the VTMISFET.

From the point of view of ensuring a large on-current in the operating state of a VTMISFET, a large forward substrate bias coefficient is desirable. The substrate bias coefficient ratio shown in FIG. 17 (hereinafter referred to as "substrate bias coefficient ratio") is the ratio of the forward substrate bias coefficient to the reverse substrate bias coefficient for evaluating the magnitude of the forward substrate bias coefficient. In the conventional Si-pVTMISFET the substrate bias coefficient ratio is a maximum of 1.286 (impurity concentration in the body region: $5\times10^{17}$ cm$^{-1}$), while in contrast in the SiGe-pHVTMISFET of the present invention the substrate bias coefficient ratio is at least 1.318 (impurity concentration in the body region: $5\times10^{18}$ cm$^{-3}$). That is, it is the present invention that realized for the first time a VTMISFET having a substrate bias coefficient ratio of not less than 1.3. Thus, the VTMISFET of the present invention is capable of ensuring a large on-current in its operating state.

The substrate bias coefficient and the threshold voltage of the SiGe-pHVTMISFET of the present invention can be set to respective desired values by adjusting the impurity concentration in the body region. In the SiGe-pHVTMISFET of the present invention, it is preferable that the absolute value of the threshold voltage in the case where the substrate bias is 0 V is set to 0.2 V or less. The impurity concentration in the body region of the substrate is preferably set to $1\times10^{18}$ cm$^{-3}$ or more. The absolute value of the substrate bias coefficient γ0 in the case where the substrate bias is 0 V is preferably set to a value of not less than 0.45. The substrate bias coefficient ratio is preferably set to a value of not less than 1.3, more preferably not less than 1.318. With these values thus set, the aforementioned effects can be obtained.

FIGS. 11(*a*) and 11(*b*) are diagrams showing the Vg-Id characteristic of the conventional Si-pVTMISFET and that of the SiGe-pHVTMISFET of the present invention under the condition where their threshold voltages are equalized to each other, with the substrate bias being used as a parameter; specifically, FIG. 11(*a*) is a diagram showing the Vg-Id characteristic of the conventional Si-pVTMISFET and FIG. 11(*b*) is a diagram showing the Vg-Id characteristic of the SiGe-pHVTMISFET of the present invention. In connection with FIGS. 11(*a*) and 11(*b*), the impurity concentration in the body region of each of the VTMISFETs is adjusted so that the threshold voltages $V_{th}$ of two VTMISFETs are equal to each other when the substrate bias $V_{bs}$ is 0 V. In this case, the impurity concentration in the body region of the Si-pVTMISFET is $5\times10^{17}$ cm$^{-3}$, while that in the body region of the SiGe-HVTMISFET is $1\times10^{18}$ cm$^{-3}$, which is twice as high as $5\times10^{17}$ cm$^{-3}$.

Since the channel region of the SiGe-pHVTMISFET of the present invention is formed of SiGe, the threshold voltage of the SiGe-pHVTMISFET can be adjusted to a value substantially equal to the threshold voltage of the Si-pVTMISFET, with the impurity concentration in the body region of the SiGe-pHVTMISFET being kept high. As a result, the SiGe-pHVTMISFET realizes a very large substrate bias coefficient γ as compared to the Si-pVTMISFET. This is attributed to the features that: the impurity concentration in SiGe the body region 23 can be kept high; and the SiGe-pHVTMISFET can employ the buried channel structure. Thus, the SiGe-pHVTMISFET realized by the present invention is a high-performance transistor capable of generating a high driving current by decreasing the substrate bias $V_{bs}$ in the operating state and of reducing the off-leakage current by increasing the substrate bias $V_{bs}$ in the stand-by state.

Figure 12:
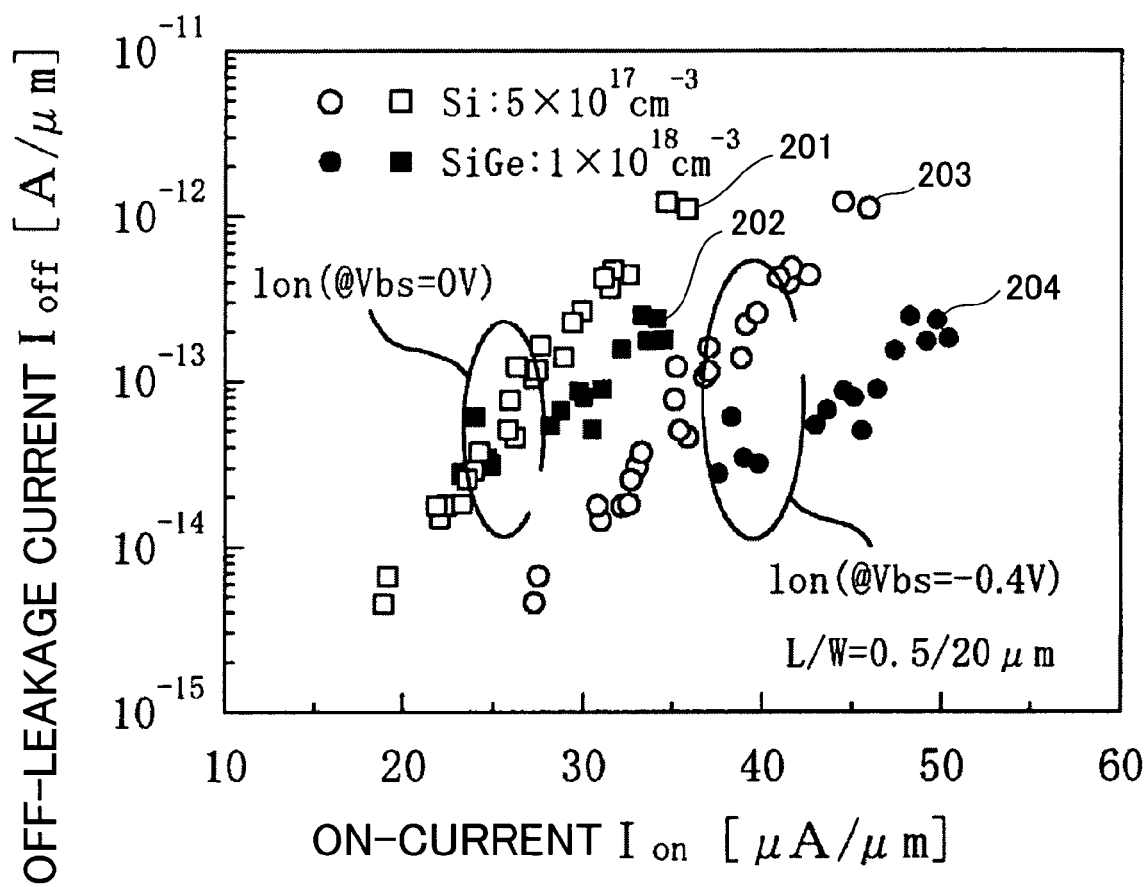
FIG. 12 is a diagram expressing the Vg-Id characteristics of the Si-pVTMISFET and SiGe-pHVTMISFET shown in FIG. 11 as respective $I_{on}$-$I_{off}$ characteristics.

FIG. 12 is a diagram expressing the Vg-Id characteristics of the conventional Si-pVTMISFET and SiGe-pHVTMISFET of the present invention shown in FIG. 11 as respective on-current $I_{on}$ vs. off-leakage current $I_{off}$ characteristics. The drain voltage of each VTMISFET is fixed to −1 V. FIG. 12 plots on-current $I_{on}$ (drain current) as the abscissa and off-current $I_{off}$ as the ordinate. In FIG. 12, circular white plots 203 (hereinafter referred to as "plots 203" simply) and square white plots 201 (hereinafter referred to as "plot 201" simply) represent on-current $I_{on}$ data and off-leakage current $I_{off}$ data, respectively, of the conventional Si-pVTMISFET, while circular black plots 204 (hereinafter referred to as "plots 204" simply) and square black plots 202 (hereinafter referred to as "plot 202" simply) represent on-current $I_{on}$ (drain current) data and off-leakage current $I_{off}$ data, respectively, of the SiGe-pHVTMISFET of the present invention. The plots 203 and the plots 204 are obtained from respective Vg-Id characteristic curves in the case where the substrate bias $V_{bs}$ is −0.4 V in the operating state and 0.8 V in the stand-by state, respectively. The plots 201 and the plots 202 are obtained from respective Vg-Id characteristic curves in the case where the substrate bias $V_{bs}$ is 0 V in the operating state and 0.8 V in the stand-by state, respectively.

As seen from FIG. 12, when the conventional Si-pVTMISFET and the SiGe-pHVTMISFET of the present invention exhibit off-leakage currents of equal value, an on-current $I_{on}$ obtained in the SiGe-pHVTMISFET of the present invention (plots 202 and 204) is higher than that obtained in the conventional Si-pVTMISFET (plots 201 and 203). This is attributed to a large shift in threshold voltage caused by an increased substrate bias coefficient γ possessed by the SiGe-pHVTMISFET having the buried channel structure with a high impurity concentration in the body region and to the hole mobility in the SiGe channel region 24 higher than that in the Si channel region. When the substrate bias $V_{bs}$ is applied forwardly ($V_{bs}$=−0.4 V) in the operating state, the difference in on-current $I_{on}$ between the conventional Si-pVTMISFET and the SiGe-pHVTMISFET of the present invention becomes conspicuous. Stated otherwise, a higher $I_{on}/I_{off}$ ratio can be obtained in the SiGe-pHVTMISFET of the present invention.

That is, application of a forward substrate bias $V_{bs}$ in the operating state is effective in obtaining a higher on-current $I_{on}$ (drain current Id) in the SiGe-pHVTMISFET of the present invention. This is because the difference in threshold voltage $V_{th}$ between the operating state and the stand-by state is conspicuously large due to a low potential relative to transit of carriers in the SiGe channel region 24. Conversely, this means that in a MIS transistor adapted to be driven under application of a forward substrate bias $V_{bs}$ in the operating state, it is effective that the channel region thereof is formed of a material having a smaller band gap than the cap layer thereof and, at the same time, has the buried channel structure.

As described above, the subject embodiment is capable of increasing the substrate bias coefficient γ, which is the ratio of a change in the threshold voltage $V_{th}$ to a change in the substrate bias $V_{bs}$, even when the threshold voltage $V_{th}$ is lowered and, therefore, the subject embodiment is capable of largely shifting the threshold voltage of the VTMIS transistor in response to the change in substrate bias. For this reason, the subject embodiment is capable of enhancing the drive current in the operating state while reducing the off-leakage current in the stand-by state. That is, the subject embodiment is effective as a transistor that operates at a high speed with low power consumption.

Further, since the subject embodiment is capable of keeping the threshold voltage $V_{th}$ low even when the impurity concentration in the body region is raised, the subject embodiment has an improved resistance to the short channel effect thereby making it possible to keep the operation of even a short gate-length transistor normal. For this reason, the subject embodiment provides for higher integration and higher performance.

While the subject embodiment is an embodiment wherein the present invention is applied to a pHVTMISFET having a SiGe channel region, it is needless to say that the present invention is applicable to a HVTMISFET having a SiC channel region (particularly of the n-channel type) containing a trace amount of C or a SiGeC channel region (of any one of the p-channel type and the n-channel type) containing a trace amount of C on a Si substrate. Where the present invention is applied to such a HVTMISFET having a SiC channel region containing a trace amount of C on a Si substrate, it is possible to realize an n-channel type MISFET (nHVTMISFET) functioning as a transistor that operates at a high speed with low power consumption by utilizing large band discontinuity (hetero barrier) developed at a conduction band edge.

While the subject embodiment uses the bulk Si substrate, it is possible to use a SOI substrate. Use of such a SOI substrate makes it easy to isolate the body regions of respective HVTMISFETs to inhibit electrical connection therebetween and, hence, substrate bias $V_{th}$ control on a HVTMISFET-by-HVTMISFET basis becomes easy.

Second Embodiment

This embodiment is an embodiment wherein the present invention is applied to a complementary HVTMIS device having SiGe channels.

FIGS. 13(a), 13(b) and 13(c) are views showing the construction of a cHVTMIS device according to a second embodiment of the present invention; specifically, FIG. 13(a) is a sectional view showing the structure of the cHVTMIS device according to this embodiment, FIG. 13(b) is an energy band diagram showing a band state of a pHVTMISFET under application of a gate bias (in the operating state) and FIG. 13(c) is an energy band diagram showing a band state of an NHVTMISFET under application of a gate bias (in the stand-by state).

As shown in FIG. 13(a), the cHVTMIS device according to the subject embodiment includes a p-type Si substrate 10, a buried oxide film 11 formed by implanting oxygen ions into the Si substrate or by a like process, a semiconductor layer 30 formed on the buried oxide film 11 for a p-channel HVTMISFET (pHVTMISFET), and a semiconductor layer 80 formed on the buried oxide film 11 for an n-channel HVTMISFET (nHVTMISFET). The semiconductor layer 30 comprises an upper Si film 12, a Si buffer layer 13 of about 10 nm thickness epitaxially grown on the upper Si film 12 by the UHV-CVD process, a SiGe film 14 (Ge content: 30%) of about 15 nm thickness epitaxially grown on the Si buffer layer 13 by the UHV-CVD process, and a Si cap layer 15 of about 5 nm thickness epitaxially grown on the SiGe film 14 by the UHV-CVD process, these films and layers forming an upper part of a SOI substrate. On the other hand, the semiconductor layer 80 comprises an upper Si film 52 formed on the buried oxide film 11, a Si buffer layer 53 epitaxially grown on the upper Si film 52 by the UHV-CVD process, a SiGe film 54 epitaxially grown on the Si buffer layer 53 by the UHV-CVD process, and a Si film 55 epitaxially grown on the SiGe film 54 by the UHV-CVD process. The thicknesses of Si buffer layer 53, SiGe film 54 and Si film 55 of the semiconductor layer 80 are equal to the thicknesses of Si buffer layer 13, SiGe film 14 and Si cap layer 15 of the semiconductor layer 30, respectively.

The cHVTMIS device further includes gate insulators 16 and 56 formed of respective silicon oxide films on the semiconductor layers 30 and 80, respectively, gate electrodes 17 and 57 provided on the gate insulators 16 and 56, respectively, and sidewalls 18 and 58 each formed on both sides of a respective one of the gate electrodes 17 and 57. A source region 20a and a drain region 20b, which contain a high concentration of a p-type impurity, are provided in regions of the semiconductor layer 30 situated on the both sides of the gate electrode 17 in plan view. A source region 60a and a drain region 60b, which contain a high concentration of an n-type impurity, are provided in regions of the semiconductor layer 80 situated on the both sides of the gate electrode 57 in plan view. A region of the upper Si film 12 located between the source region 20a and the drain region 20b defines therein a Si body region 22 containing a high concentration of the n-type impurity, while a region of the Si buffer layer 13 located between the source region 20a and the drain region 20b defines therein an n⁻Si region 23 containing a low concentration of the n-type impurity. A region of the SiGe film 14 located between the source region 20a and the drain region 20b defines therein a SiGe channel region 24 containing a low concentration of the n-type impurity, while a region of the Si film 15 located between the source region 20a and the drain region 20b defines therein a Si cap layer 25 containing a low concentration of the n-type impurity. On the other hand, a region of the upper Si film 52 located between the source region 60a and the drain region 60b defines therein a Si body region 62 containing a high concentration of the p-type impurity, while a region of the Si buffer layer 53 located between the source region 60a and the drain region 60b defines therein a p⁻Si region 63 containing a low concentration of the p-type impurity. A region of the SiGe film 54 located between the source region 60a and the drain region 60b defines therein a SiGe channel region 64 containing a low concentration of the p-type impurity, while a region of the Si film 55 located between the source region 60a and the drain region 60b defines therein a Si cap layer 65 containing a low concentration of the p-type impurity.

Though not shown, the substrate is provided thereon with an interlayer dielectric, contacts extending through the interlayer dielectric to contact the source-drain regions 20a, 20b, 60a and 60b, and source-drain electrodes connected to the respective contacts and extending on the interlayer dielectric.

In the fabrication process for the cHVTMIS device according to the subject embodiment, the upper Si films 12 and 52 (body regions) forming part of respective SOI substrates are an n$^+$Si layer (in the pHVTMISFET region) and p$^+$Si layer (in the nHVTMISFET region), respectively, the n$^+$Si layer and p$^+$Si layer being doped with respective impurities to a concentration of about $1\times10^{18}$ atoms·cm$^{-3}$ by ion implantation prior to crystal growth, while any one of the Si buffer layers, SiGe channel regions and Si cap layers in an as-grown state is an undoped layer not doped with an impurity. At that time, the thicknesses of each Si buffer layer, each SiGe channel layer and each Si cap layer are 10 nm, 15 nm and 5 nm, respectively. The Ge content in the SiGe channel regions is 30%. After the completion of crystal growth of the SiGe films and Si cap layers, a portion around the SiGe channel region in the nHVTMISFET is doped with the p-type impurity to a concentration of about $1\times10^{17}$ atoms·cm$^{-3}$ by ion implantation. As well, a portion around the SiGe channel region in the pHVTMISFET is doped with the n-type impurity to a concentration of about $1\times10^{17}$ atoms·cm$^{-3}$ by ion implantation. Note that the SiGe films and the Si cap layers may be left undoped. Subsequently, the Si cap layers as the topmost layers are thermally oxidized to form silicon oxide films for use as the gate insulators, and then the n-type gate electrode formed of polysilicon heavily doped with the n-type impurity and the p-type gate electrode formed of polysilicon heavily doped with the p-type impurity are formed on the respective gate insulators. Thereafter, the n$^+$-type source-drain regions heavily doped with the n-type impurity by ion implantation and the p$^+$-type source-drain regions heavily doped with the p-type impurity by ion implantation are formed on both sides of respective gate electrode, followed by formation of source electrode and drain electrode above respective one of the n$^+$-type source-drain regions and the p$^+$-type source-drain regions, respectively. Though not shown, the upper Si films (Si body regions 22 and 62) are connected to respective overlying wiring via respective contacts.

As shown in FIG. 13(b), in the pHVTMISFET the substrate bias $V_{bs}$ is 0 bias or a forward bias in the operating state and application of a gate bias causes a p-channel having a low potential relative to transit of holes to be formed in the SiGe channel region 24, as has been described in the first embodiment.

As shown in FIG. 13(c), in the nHVTMISFET the substrate bias $V_{bs}$ is 0 bias or a forward bias in the operating state and application of a gate bias causes an n-channel to be formed in the Si cap layer 65. Since conduction band discontinuity can hardly be developed at the heterojunction between Si and SiGe, the nHVTMISFET of the cHVTMIS device according to the subject embodiment has an operating function equivalent to that of the conventional n-channel Si-VTMISFET.

The construction of the cHVTMIS device according to the subject embodiment has an advantage of enabling a complementary HVTMIS device to be fabricated by a simplified process.

Particularly where boron is used as the impurity with which the Si body region 62 of the nHVTMISFET is doped, the presence of the SiGe channel region 64 between the Si buffer region 63 and the Si cap layer 65 inhibits the diffusion of boron from the Si body region 62 into the Si cap layer 65. Accordingly, the impurity concentration in the channel region formed in a region of the Si cap layer 65 situated adjacent the interface with the gate insulator 56 can be reduced. This is attributed to a lower diffusion coefficient of boron in a SiGe region than in a Si region. As a result, it is possible to lower the threshold voltage $V_{th}$ of the nHVTMISFET as well as to reduce the deterioration of electron mobility due to scattering by the impurity. Thus, a high drive current can be realized. Further, since the threshold voltage of the nHVTMISFET can be lowered, it is also possible to increase the substrate bias coefficient γ by raising the impurity concentration in the Si body region 62.

Third Embodiment

While the channel regions in the first and second embodiments are formed of SiGe, these channel regions may be formed of SiGeC having a C (carbon) content of 0.01% to 2% (for example, about 1%). The addition of C in each SiGe channel region further enhances the effect of the SiGe channel region. Though ion implantation into a SiGe crystal has a strong tendency to cause the crystal structure thereof to change undesirably, it is possible to inhibit such an undesirable change of crystal structure caused by ion implantation by forming a channel region of SiGeC.

FIGS. 14(a), 14(b) and 14(c) are views showing the construction of a cHVTMIS device according to this embodiment; specifically, FIG. 14(a) is a sectional view showing the structure of the cHVTMIS device, FIG. 14(b) is an energy band diagram showing a band state of a pHVTMISFET under application of a gate bias (in the operating state) and FIG. 14(c) is an energy band diagram showing a band state of an nHVTMISFET under application of a gate bias (in the stand-by state). In the subject embodiment the channel regions are formed of SiGeC.

The cHVTMIS device shown in FIG. 14(a) can be obtained by substitution of SiGeC films 19 and 59 for the SiGe films 14 and 54, respectively, of the pHVTMISFET and nHVTMISFET shown in FIG. 13 and substitution of SiGeC channel regions 29 and 69 for the SiGe channel regions 24 and 64, respectively, of the pHVTMISFET and nHVTMISFET shown in FIG. 13. The structures of other parts are the same as those of corresponding parts of the cHVTMIS device shown in FIG. 13.

As shown in FIGS. 14(b) and 14(c), the subject embodiment has buried channels (SiGeC buried p-channel and SiGeC buried n-channel) formed in the pHVTMISFET and the nHVTMISFET, respectively.

FIG. 15 is a block circuit diagram showing a circuit configuration for applying a substrate bias $V_{bs}$ to each of the nHVTMISFET and pHVTMISFET according to the subject embodiment. As shown in FIG. 15, the p-well (p-body region) of the nHVTMISFET and the n-well (n-body region) of the pHVTMISFET are each applied with a substrate bias $V_{bs}$ by a substrate bias control circuit 50 so that the threshold voltage of each HVTMISFET is lowered in the operating state and raised in the stand-by state. The region to be applied with the substrate bias, which is sufficient to be located below the associated channel region, is called a well or a body region. Such a region is a p-type region in an n-type transistor or an n-type region in a p-type transistor.

According to the subject embodiment having the channel regions formed of SiGeC, both valence band discontinuity and conduction band discontinuity (hetero barrier) are allowed to develop at a Si/SiGeC heterojunction thereby forming n-channel and p-channel both of which are of the buried channel structure. That is, since the nHVTMISFET also has a buried channel, this transistor is capable of lowering its threshold voltage $V_{th}$ as well as of increasing its substrate bias coefficient γ like the pHVTMISFET according to the first embodiment. Therefore, both the pHVTMISFET and nHVTMISFET according to the subject embodiment can realize a high $I_{on}/I_{off}$ ratio. Moreover, the SiGeC films 19 and 59 for defining the p-channel region (SiGeC channel region 29) and the n-channel region (SiGeC channel region 69), respectively, can be formed by a single epitaxial growth step. This results in reduced fabrication cost.

As has been described in the second embodiment, the effect of inhibiting the diffusion of boron from the Si body region 62 into the Si cap layer 65 can be exhibited more remarkably by the presence of the SiGeC channel region 69. Conceivably, this is because C atoms fill vacancy causing transient enhanced diffusion of the impurity.

While only certain presently preferred embodiments of the present invention, which should be construed as not limitative but illustrative of the present invention, have been described in detail for the purpose of teaching the best mode for carrying out the invention to those skilled in the art, as will be apparent for those skilled in the art, various modifications and other variations can be made in the embodiments without departing from the spirit and scope of the present invention as defined by the following claims.

What is claimed is:

1. A semiconductor device comprising:
   a semiconductor layer;
   a gate insulator provided on the semiconductor layer;
   a gate electrode provided on the gate insulator;
   a source region and a drain region, which are of a first conductivity type and are provided in the semiconductor layer on both sides of the gate electrode in plan view;
   a cap layer, a channel region, and an under-channel region which are provided in the semiconductor layer between the source region and the drain region in a descending order from an interface with the gate insulator the under-channel region being of a second conductivity type; and
   a bias electrode member for applying a voltage to the under-channel region, wherein
   the channel region is formed of a first semiconductor,
   the cap layer and the under-channel region are formed of a second semiconductor and a third semiconductor, respectively, each of which has a larger band gap than the first semiconductor,
   the bias electrode member is capable of applying the voltage independently of the gate electrode.

2. The semiconductor device according to claim 1, wherein an absolute value of a threshold voltage is 0.2 V or less when a voltage applied to the bias electrode member is 0 V.

3. The semiconductor device according to claim 1, wherein an impurity concentration of the under-channel region is $1 \times 10^{18}$ cm$^{-3}$ or more.

4. The semiconductor device according to claim 1, wherein when a voltage applied to the bias electrode member is near 0 V, an absolute value of a rate of change in a threshold voltage relative to a change in the voltage applied to the bias electrode member is 0.45 or more.

5. The semiconductor device according to claim 1, wherein when the bias electrode member is applied with a forward bias voltage and a reverse bias voltage which bias junctions formed between the drain region or the source region and the cap layer, between the drain region or the source region and the channel region, and between the drain region or the source region and the under-channel region in a forward direction and a reverse direction, respectively, the ratio of a rate of change in a threshold voltage relative to a change in an applied voltage under the application of the forward bias voltage to a rate of change in the threshold voltage relative to a change in the applied voltage under the application of the reverse bias voltage is 1.3 or more.

6. The semiconductor device according to claim 5, wherein said ratio is 1.318 or more.

7. The semiconductor device according to claim 1, wherein a thickness of the cap layer is not less than 1 nm and not more than 10 nm.

8. The semiconductor device according to claim 1, wherein the first semiconductor is a semiconductor comprising SiGe as a major component, while the second and third semiconductors are each formed of Si.

9. The semiconductor device according to claim 8, wherein: the source region and the drain region have p-type conductivity; and a p-channel is formed in the channel region under a predetermined condition.

10. The semiconductor device according to claim 1, wherein the first semiconductor is a semiconductor comprising SiGeC as a major component, while the second and third semiconductors are each formed of Si.

11. The semiconductor device according to claim 10, wherein: the source region and the drain region have n-type conductivity; and an n-channel is formed in the channel region under a predetermined condition.

12. The semiconductor device according to claim 11, wherein the under-channel region is doped with boron.

13. The semiconductor device according to claim 1, wherein an insulating layer is provided under the semiconductor layer.

14. A complementary semiconductor device comprising a first semiconductor device and a second semiconductor device, each of which is formed of the semiconductor device according to claim 1:wherein
   in the first semiconductor device, the source region and the drain region have p-type conductivity and a p-channel is formed in the channel region under a predetermined condition; and
   in the second semiconductor device, the source region and the drain region have n-type conductivity and an n-channel is formed in the channel region under a predetermined condition.

15. The complementary semiconductor device according to claim 14, wherein in each of the first and second semiconductor devices, the first semiconductor is a semiconductor comprising SiGeC as a major component while the second and third semiconductors are each formed of Si.

* * * * *